United States Patent
Ito et al.

(10) Patent No.: US 8,698,140 B2
(45) Date of Patent: Apr. 15, 2014

(54) SEMICONDUCTOR DEVICE, AND TEST METHOD FOR SAME

(75) Inventors: Kiyoto Ito, Kodaira (JP); Takanobu Tsunoda, Kokubunji (JP); Makoto Saen, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 76 days.

(21) Appl. No.: 13/521,961

(22) PCT Filed: Mar. 15, 2010

(86) PCT No.: PCT/JP2010/054357
§ 371 (c)(1),
(2), (4) Date: Jul. 12, 2012

(87) PCT Pub. No.: WO2011/114428
PCT Pub. Date: Sep. 22, 2011

(65) Prior Publication Data
US 2012/0280231 A1  Nov. 8, 2012

(51) Int. Cl.
*H01L 23/58* (2006.01)

(52) U.S. Cl.
USPC ............ 257/48; 257/E23.141; 257/E21.531; 438/15; 438/16; 438/26

(58) Field of Classification Search
USPC .......... 257/48, E23.141, E21.531; 438/15–26
See application file for complete search history.

(56) References Cited

U.S. PATENT DOCUMENTS

| | | | |
|---|---|---|---|
| 6,286,121 B1 * | 9/2001 | Osawa et al. | 714/738 |
| 7,046,522 B2 * | 5/2006 | Sung et al. | 361/803 |
| 7,218,133 B2 * | 5/2007 | Lewis et al. | 326/10 |
| 7,411,413 B2 * | 8/2008 | Shimazaki et al. | 326/16 |
| 8,122,413 B2 * | 2/2012 | Hom et al. | 716/116 |
| 8,362,482 B2 * | 1/2013 | Or-Bach et al. | 257/48 |
| 8,362,800 B2 * | 1/2013 | Or-Bach et al. | 326/12 |
| 2002/0020904 A1 | 2/2002 | Hikita et al. | |
| 2003/0025191 A1 | 2/2003 | Takeoka et al. | |
| 2003/0178228 A1 * | 9/2003 | Sung et al. | 174/259 |
| 2006/0220672 A1 | 10/2006 | Sato | |
| 2007/0252617 A1 * | 11/2007 | Lewis et al. | 326/41 |
| 2008/0307280 A1 * | 12/2008 | Putman et al. | 714/727 |
| 2010/0169856 A1 * | 7/2010 | Hom et al. | 716/6 |

FOREIGN PATENT DOCUMENTS

| | | |
|---|---|---|
| JP | 11-174122 A | 2/1999 |
| JP | 2000-227457 A | 8/2000 |
| JP | 2001-141790 A | 5/2001 |

* cited by examiner

*Primary Examiner* — Alexander Sofocleous
*Assistant Examiner* — Ankush Singal
(74) *Attorney, Agent, or Firm* — Miles & Stockbridge P.C.

(57) ABSTRACT

It has been difficult to carry out a test and an analysis with respect to combinational logic circuits mounted across plural chips, and therefore, there is provided a flip-flop (31*b*) by use of which either of a scan chain within a semiconductor chip (LSI_B), and a scan chain across plural semiconductor chips (LSI_A and LSI_B) can be made up.

17 Claims, 16 Drawing Sheets

SEMICONDUCTOR DEVICE, AND TEST METHOD FOR SAME

TECHNICAL FIELD

The present invention relates to a semiconductor device, and in particular, to techniques for testing a group of LSIs that are die-stacked.

BACKGROUND ART

Enhancement in performance of a semiconductor device by integration over a single LSI chip is not necessarily the optimum solution lately owing to the impact of limitations to miniaturization, and an increase in utilization cost of the most advanced process technology. Accordingly, integration in three-dimensional directions, implemented by stacking a plurality of LSIs one another has since attracted attention as a promising technology.

A system of electrical connection between stacked LSIs is important for realization of both desired function and performance of the stacked LSIs. A TSV (Through Silicon Via) system whereby a hole is bored in a silicon chip, and the hole is filled up with a conductor, thereby electrically connecting the surface of the chip with the back surface thereof is expected to be capable of miniaturization of electrodes in a stacking direction (TSVs) to such an extent as to approach metal interconnections on an LSI chip in respect of miniaturization, and as such, is regarded promising as the next-generation connection technology among systems for connection between the stacked LSIs. Accordingly, it is imagined that the days are not far off when logic circuits connected with each other by the TSVs across plural LSIs will be made up.

FIG. 1 is a view showing an example of a configuration of a three-dimensional logic circuit which is made up of plural LSIs in such stacked LSIs as described.

The three-dimensional logic circuit is comprised of two layers of LSI chips, referred to LSI_A, and LSI_B, respectively, and combinational logic circuits A, B, and D are mounted on LSI_A, while combinational logic circuits C, E are mounted on LSI_B, respectively. Further, TSVs 20a, 20b are provided between LSI_A and LSI_B, respectively, and a signal is propagated between the combinational logic circuits B, C, as well as between the combinational logic circuits D, E. Reference numerals 30a to 30h each are a flip-flop with a scan function attached thereto, for storing input/output data of the respective combinational logic circuits.

Data from each of the flip-flops 30a, 30b on LSI_A is inputted to the combinational logic circuit A, whereupon the combinational logic circuit A performs an operation therein, results of the operation being outputted to the combinational logic circuit D. Data from the flip-flop 30c on LSI_A, and data from the combinational logic circuit C on LSI_B via the TSV 20a are inputted to the combinational logic circuit B, whereupon the combinational logic circuit B performs an operation therein, results of the operation being outputted to the combinational logic circuit D. Data from each of the flip-flops 30d, 30e, on the LSI_B, is inputted to the combinational logic circuit C, whereupon the combinational logic circuit C performs an operation therein, results of the operation being outputted to the combinational logic circuit B on the LSI_A, and the combinational logic circuit E on the LSI_B. Data from the combinational logic circuit A, and data from the combinational logic circuit B are inputted to the combinational logic circuit D, whereupon the combinational logic circuit D performs an operation therein, results of the operation being outputted to the flip-flop 30f, the flip-flop 30g, and the combinational logic circuit E on the LSI_B.

Data from the combinational logic circuit C, and data from the combinational logic circuit D on the LSI_A, via the TSV 20b, are inputted to the combinational logic circuit E, whereupon the combinational logic circuit E performs an operation therein, results of the operation being outputted to the flip-flop 30h.

A technique for performing a scan test, such as an internal scan test, a boundary scan test, and so forth, is well known as the traditional testing technique for inspecting whether or not a semiconductor device is normally made up. FIG. 2, there is shown an example of a configuration of a flip-flop 30 with a three-dimensional scan function attached thereto, for use in the scan test technique.

The flip-flop 30 with the three-dimensional scan function attached thereto incorporates a storage element 100 for signal retention, and a selector 200. The selector 200 has a function for selecting data to be inputted to the storage element 100 between a data input terminal PI and a scan input terminal SI in response to a mode designation signal md. If the mode designation signal md is "0", operation of the flip-flop 30 will be in a normal operation mode, and a signal entering from the data input terminal PI is stored in the storage element 100 for once to be subsequently outputted to a data output terminal PO. If the mode designation signal md is "1", the operation will be in a scan mode, and a signal entering from the scan input terminal SI will be in the scan mode to be stored in the storage element 100 before being outputted to the data output terminal PO, and a scan output terminal SO.

Herein, a shift register can be made up by connecting the scan output terminal SO to the respective scan input terminals SI of other flip-flops with the three-dimensional scan function attached thereto in such a way as to resemble beads strung on thread. Control of the mode designation signal md by following a predetermined procedure can render it possible to make setting of desired test data, and observation of an output result with respect to the combinational logic circuit to which this flip-flop with the three-dimensional scan function attached thereto is connected. A path for use in the setting of the test data, and the observation is called as a scan chain, and a path indicated by a dash and a dotted line, in, for example, the logic circuit of FIG. 1, is the scan chain. FIG. 1, interconnections for use in distribution of the mode designation signal md are omitted for the sake of simplicity.

There is described hereinafter the case of performing the scan test against a semiconductor device built on one sheet of LSI chip, for example, the LSI_A shown in FIG. 1.

First, the flip-flops 30a, 30b, and 30c with the scan function attached thereto are each actuated in the scan mode, and concurrently, a predetermined test pattern from outside the logic circuit is inputted thereto from a test data input terminal TDI_A prepared as an external terminal. Next, the flip-flops 30a, 30b, and 30c are set to the normal operation mode, and the combinational logic circuits A, B, and D are actuated. Then, an output of the combinational logic circuit D is fetched by the flip-flops. Thereafter, the flip-flops 30a, 30b, and 30c are again set to the normal operation mode, and respective values fetched by the flip-flops 30f, 30g, with the three-dimensional scan function attached thereto, respectively, are observed from outside the logic circuit by use of a test data output terminal TDO_A prepared as an external terminal.

As a technology for expanding application of the scan test to the plural LSIs, there have been disclosed techniques whereby respective test data input terminals of plural chips, and respective test data output terminals of the plural chips are connected with each other in a such way as to resemble the beads strung on thread, as shown in, for example, Patent Literature 1, and techniques whereby a branch interconnection is provided before and after respective test data input terminals as well as respective test data output terminals, as shown in, for example, Patent Literature 2.

CITATION LIST

Patent Literature

Patent Literature 1: US 2006/0220672
Patent Literature 2: US 2003/0025191

SUMMARY OF INVENTION

Technical Problem

However, in the case of stacked LSIs connected with each other by TSVs, there exist problems un-assumed by the traditional testing technique in order to perform a scan test against the logic circuit made, up across the plural LSIs, as shown FIG. 1.

For example, the combinational logic circuit B receives an input of data not only from the flip-flop 30c on the LSI_A, but also from the respective inputs of data from the combinational logic circuits C on the LSI_B, so that all the functions cannot be tested by use of the scan chain provided on the LSI_A, alone, the scan chain extending from TDI_A to TDO_A. Similarly, the combinational logic circuit E receives the input of data from not only the combinational logic circuit C on the LSI_B, but also the combinational logic circuit D on the LSI_A, so that all the functions cannot be tested by use of the scan chain provided on the LSI_B, alone, the scan chain extending from TDI_B to TDO_B.

More specifically, with the logic circuit built across plural LSI chips, it is not possible to perform a test on the basis of respective LSI chip units, as described above, so that there exists a problem in that test data across the plural LSI chips must be concurrently set before the test is performed.

In this case, with the stacked LSIs built by use of the TSVs, an LSI chip piled up in the middle thereof does not have an exposed plane from which external terminals are drawn out, so that the external terminals can be disposed on the LSI chip in the topmost layer or the lowermost layer. Accordingly, in order to enable access after stacking to be concurrently made to the four terminals including TDI_A, TDO_A, TDI_B, TDO_B, respectively, it is necessary to additionally provide external terminals, the respective external terminals being drawn out independently from each other. In such a case, since the number of the external terminals dedicated for testing will increase, and an extra chip area is occupied, there arises a problem of an increase in the manufacturing cost of the stacked LSIs.

On the other hand, there is available a method for inserting the flip-flop 30 with the three-dimensional scan function attached thereto at the respective ends of the TSV 20a, and the TSV 20b, as in the case of the traditional boundary scan test, and setting a test pattern against a signal transmitted from the combinational logic circuit C to reach the combinational logic circuit B via the scan chain provided on the LSI_A. However, since the flip-flop 30 with the three-dimensional scan function attached thereto is inserted against all the TSVs, there exists a problem of an increase in area occupied by the circuits, delay in the circuits, power consumption, and so forth.

Further, in the case where the respective test data input terminals of the plural chips, and the respective test data output terminals of the plural chips are connected with each other in the same way as the beads strung on thread, as shown in Patent Literature 1, for connection of, for example, the test data output terminal TDO_A of the LSI_A to the test data input terminal TDI_B of the LSI_B, there is the need for setting via the can chain made up by connecting all the flip-flops with the scan function thereto with each other in the way resembling the beads strung on thread in order to input test data to the flip-flops 30d, 30e, on the LSI_B, respectively. In consequence, there occurs the need for massive shift operations, thereby raising a problem of an increase in test time and an increase in the number of test patterns required for control of the shift operations.

With the method whereby the scan chain is provided with the input branch interconnections and the output branch interconnections, as in the case of Patent Literature 2, it is necessary to cause setting information pieces required for control of the respective branch interconnections to be propagated to the LSI_A, and the LSI_B, respectively, so that there are the needs for inputting these setting information pieces via dedicated interconnections for testing or the scan chain, and the problem described as above is therefore not solved as yet.

The present invention has been developed in view of the problems described as above, and it is an object of the invention to provide a semiconductor device comprised of combinational logic circuits mounted across a plurality of chips, a test as well as an analysis being easily carried out with respect to the combinational logic circuit without causing an increase in the number of external terminals as well as the circuits, and an increase in the number of test patterns.

Solution to Problem

Representative embodiments of the invention, disclosed in the present application, are briefly described as follows.

Firstly, there is provided a semiconductor device as a single semiconductor chip, the semiconductor device comprising a first combinational logic circuit, a first storage element for storing an input signal to the first combinational logic circuit, a first selector for selecting a signal to be stored by the first storage element from a signal from a first terminal or a signal from a second terminal, a scan chain with the first storage element connected thereto, provided without the intermediary of the first combinational logic circuit, a first electrode for receiving a predetermined potential from other semiconductor chip if the semiconductor chip, and the other semiconductor chip are stacked to each other, wherein a test signal supplied to the semiconductor chip is inputted to a first terminal, and a test signal supplied to the other semiconductor chip is inputted to a second terminal, if the predetermined potential is not supplied to the first electrode, the first selector selects the first terminal, and if the predetermined potential is supplied to the first electrode, the first selector selects the second terminal, Secondly, there is provided semiconductor device including a first semiconductor chip, and a second semiconductor chip, stacked to each other, the first semiconductor chip comprising a first combinational logic circuit, a first storage element for storing an input signal to the first combinational logic circuit, a second storage element for storing an output signal from the first combinational logic circuit, a first selector for selecting a signal to be stored by the first storage element from a signal from a first terminal or a signal from a second terminal, a first scan chain provided between the first second storage element and the second storage element without the intermediary of the first combinational logic circuit, and a first electrode and a second electrode, connected to the second semiconductor chip, the second semiconductor chip comprising, a second combinational logic circuit, a third storage element for storing an input signal to the second combinational logic circuit, a fourth storage element for storing an output signal from the second combinational logic circuit, a second selector for selecting a signal to be stored by the third storage element from a signal from a third terminal or a signal from a fourth terminal, a second scan chain provided between the third storage element and the fourth storage element without the intermediary of the second combinational logic circuit, and a third electrode and a fourth electrode, connected to the first semiconductor chip, said semiconductor device further comprising a first three-dimensional electrode for connecting the first electrode to the third electrode, and a second three-dimensional electrode for connecting the second electrode to the fourth electrode, wherein the second electrode gives a second potential to the fourth electrode via the second three-dimensional electrode, and the second selector selects information from the fourth terminal upon delivery of the second potential to the fourth electrode.

Thirdly, there is provided a semiconductor device testing method comprising the steps of preparing a semiconductor device wherein a first semiconductor chip having a first electrode and a second electrode is stacked to a second semiconductor chip including a second combinational logic circuit, a third storage element for storing input information to the second combinational logic circuit, a fourth storage element for storing output information from the second combinational logic circuit, a second selector for selecting a signal to be stored by the third storage element from a signal from a third terminal or a signal from a fourth terminal, a third electrode, a fourth electrode, and a second scan chain provided between the third storage element and the fourth storage element without the intermediary of the second combinational logic circuit, the semiconductor device being set such that the first electrode is connected to the third electrode via a first three-dimensional electrode, the second electrode is connected to the fourth electrode via a second three-dimensional electrode, and the second selector selects information from the fourth terminal upon a second potential from the second electrode being given to the fourth electrode via the second three-dimensional electrode to be outputted to the third storage element, and supplying a first signal for testing the second combinational logic circuit to the second combinational logic circuit via the first electrode.

Advantageous effects of Invention

With the present invention, a test as well as an analysis on LSII chips can be easily conducted.

DESCRIPTION OF EMBODIMENTS

There are described hereinafter specific embodiments of a semiconductor device according to the invention in detail with reference to the accompanying drawings.

First Embodiment

Figure 3:
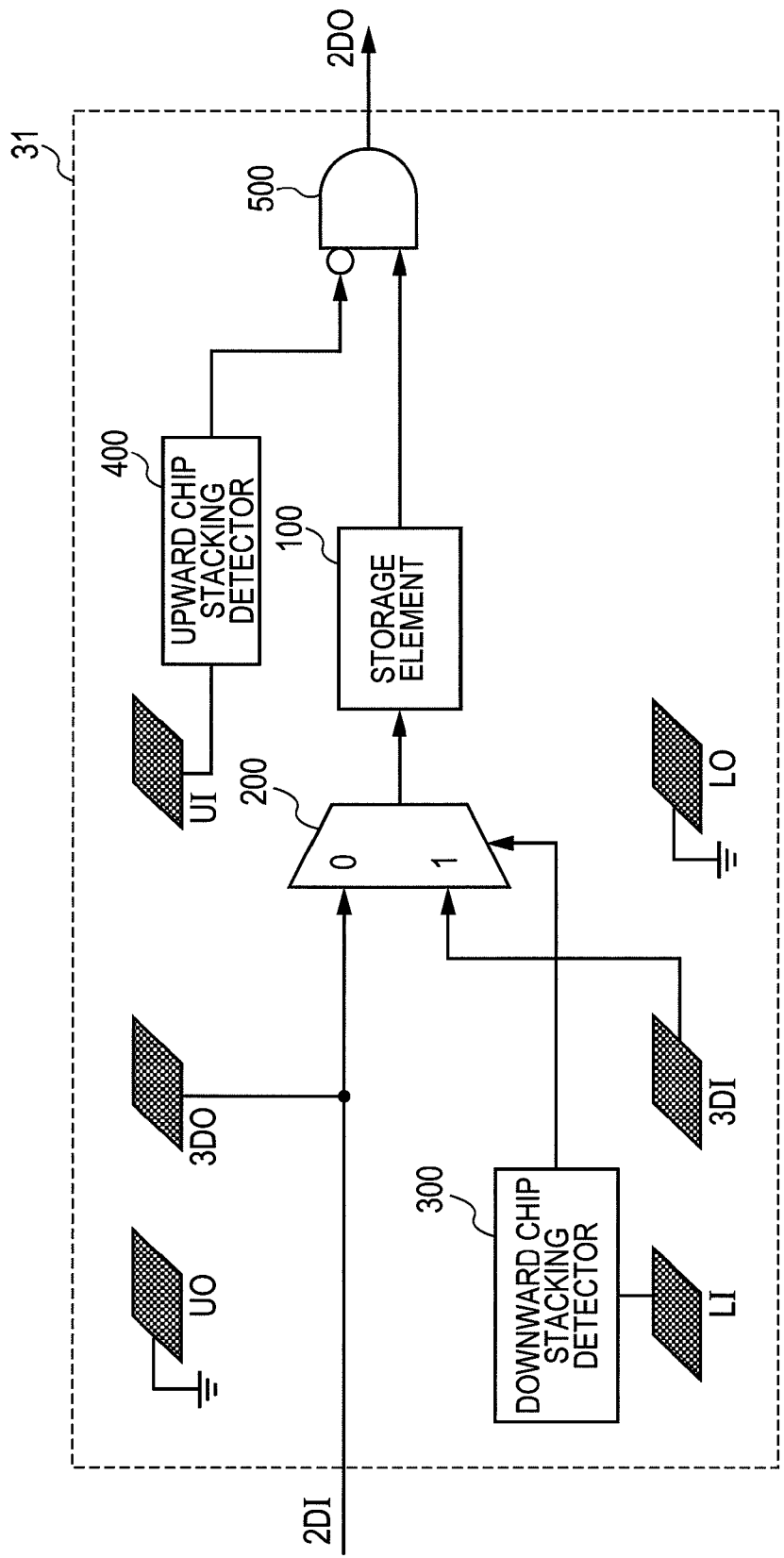
FIG. 3 is a view showing an example of a configuration of a flip-flop with a three-dimensional scan function attached thereto, according to a first embodiment of the invention.

FIG. 3 is a view showing an example of a configuration of a flip-flop with a three-dimensional scan function attached thereto, according to a first embodiment of the invention. A flip-flop 31 with the three-dimensional scan function attached thereto has a function for fetching a signal from a downward stacked chip as a data input of a scan chain.

Herein, the scan chain in the following description includes a plurality of circuits (a selector, and so forth) for selecting at least either of data at the time of an normal operation, and data at the time of testing, and a plurality of circuits (a storage element, and so forth) for storing the data as selected, the scan chain indicating a circuit where an output of the storage element, and so forth is delivered to one input (on a side adjacent to the data at the time of testing) of inputs of the next selector, and so forth. In FIG. 3, a selector 200, and a storage element 100 correspond to the circuit for selection, and the circuit for storage, respectively, serving as a part of the scan chain.

The flip-flop 31 with the three-dimensional scan function attached thereto is comprised of the storage element 100, the selector 200, a downward chip stacking detector 300, an upward chip stacking detector 400, an output control AND gate 500, 2DI/2DO, as data input/output terminals on the same chip, respectively, LI, 3DI, LO, as three electrodes for input/output of a signal downward of the chip, respectively, and UO, 3DO, UI, as three electrodes for input/output of a signal upward of the chip, respectively.

2DI denotes a two-dimensional data input terminal for data from circuit blocks on the same chip, and 2DO denotes a two-dimensional data output terminal for data outputted to the circuit blocks on the same chip. 3DI denotes a three-dimensional scan input terminal from a lower layer chip, and 3DO denotes a three-dimensional scan output terminal toward an upper layer chip. According to the configuration shown in FIG. 3, 2DI and 3DO are electrically connected with each other via interconnections shorted to each other, however, the configuration according to the present invention is not limited to this configuration, and it need only be sufficient to have a configuration where a signal identical to a signal delivered to 2DI is outputted to 3DO. LI represents a signal input from a lower chip, and LO represents a signal output to the lower chip. UI represents a signal input from an upper chip, and UO represents a signal output to the upper chip.

According to the configuration shown in FIG. 3, a ground reference potential is directly given to the lower chip signal output LO, and the upper chip signal output UO, respectively, however, the present invention is not limited to this configuration, it need only be sufficient to have a configuration where a predetermined fixed potential value is outputted.

The storage element 100 is an element having a function for storing 1 bit of digital information, the element being comprised of common flip-flops, and so forth. The selector 200 has a function for selecting data to be inputted to the storage element 100 from the two-dimensional data input terminal 2DI or the three-dimensional scan input terminal 3DI in response to a control signal from the downward chip stacking detector 300. The downward chip stacking detector 300 is a circuit block for detecting chip stacking in the lower layer in response to an input signal from a lower chip signal input LI, thereby outputting the control signal to the selector 200. More specifically, if no chip is present in the lower layer, and the lower chip signal input LI is in open state, the downward chip stacking detector 300 outputs the control signal "0", and if a chip is present in the lower layer, and a predetermined signal is given to the lower chip signal input LI, the downward chip stacking detector 300 outputs the control signal "1". Accordingly, if no chip is present in the lower layer, the two-dimensional data input terminal 2DI is inputted to the storage element 100, and if a chip is present n the lower layer, the three-dimensional scan input terminal 3DI is inputted to the storage element 100. The upward chip stacking detector 400 is a circuit block for detecting chip stacking in the upper layer in response to an input signal from the upper chip signal input UI, thereby outputting the control signal to the output control AND gate 500. More specifically, if no chip is present in the upper layer, and the upper chip signal input UI is in open state, the upward chip stacking detector 400 outputs a signal "0", and if a chip is present in the lower layer, and a predetermined potential is given to the upper chip signal input, the upward chip stacking detector 400 outputs a signal outputting AND of a reversed value of a control signal output from the upward chip stacking detector 400, and an output of the storage element 100, so that the flip-flop 31 with the three-dimensional scan function attached thereto delivers the output of the storage element 100 if no chip is present in the upper layer while outputting "0" at all times if a chip is present in the upper layer.

With the invention according to the present embodiment, a semiconductor chip (31) includes a first combinational logic circuit (provided at an output destination of 2DO; said circuit is not shown in FIG. 3, and corresponds to a combinational logic circuit C to be described later), a first storage element (100) for storing input information to the first combinational logic circuit, a first selector (200) for selecting a signal to be stored by the first storage element from a signal from a first input terminal (2DI) or a signal from a second input terminal (3DI), a scan chain (a path from 30e to 30h) connected to the first storage element, provided without the intermediary of the first combinational logic circuit, and a first electrode (LI) for connection with other semiconductor chip, characterized in that a test signal supplied to the semiconductor chip (a signal supplied via 2DI) is inputted to a first terminal while a test signal supplied to the other semiconductor chip (a signal supplied via 3DI) is inputted to the first terminal, if a predetermined potential is not given to the first electrode, the first selector selects the first terminal, and if the predetermined potential is given to the first electrode, the first selector selects the second terminal. With the adoption of the configuration described as above, a scan chain can be switched from one to another in response to the potential of the first electrode. Herein, the potential of the first electrode undergoes a change depending on whether or not the first electrode is connected to the other semiconductor chip, so that if the configuration described as above is adopted, the scan chain can be switched over in response to the presence or absence of the connection of the first electrode to the other semiconductor chip, that is, the presence or absence of stacked layers. As a result, plural scan chains can be rendered compatible with each other by use of a simple circuit-configuration.

Further, a second electrode (3DI) for connecting a first semiconductor chip to another semiconductor chip (a second semiconductor chip) is further provided, the first input terminal is used as a terminal for inputting a signal from a circuit provided in the first semiconductor chip, and the second input terminal is used as a terminal for inputting a signal from a circuit provided in the second semiconductor chip via the second electrode. By so doing, a two-dimensional scan can be rendered compatible with a three-dimensional scan.

Furthermore, with the adoption of a configuration further including a third electrode (UI) for connecting the first semiconductor chip to another semiconductor chip (a third semiconductor chip), and a first output-control circuit, the first output-control circuit executing switch-over between a first mode for outputting information stored in the first storage element to the first combinational logic circuit in response to the potential of the third electrode and a second mode for outputting a given value to the first combinational logic circuit regardless of the information stored in the first storage element. By so doing, in a state where stacked layers are present, and a three-dimensional test is conducted, it is possible to block transmission of a signal from the two-dimensional scan to a combinational logic circuit, thereby enabling erroneous operation in the combinational logic circuit to be prevented.

Figure 4:
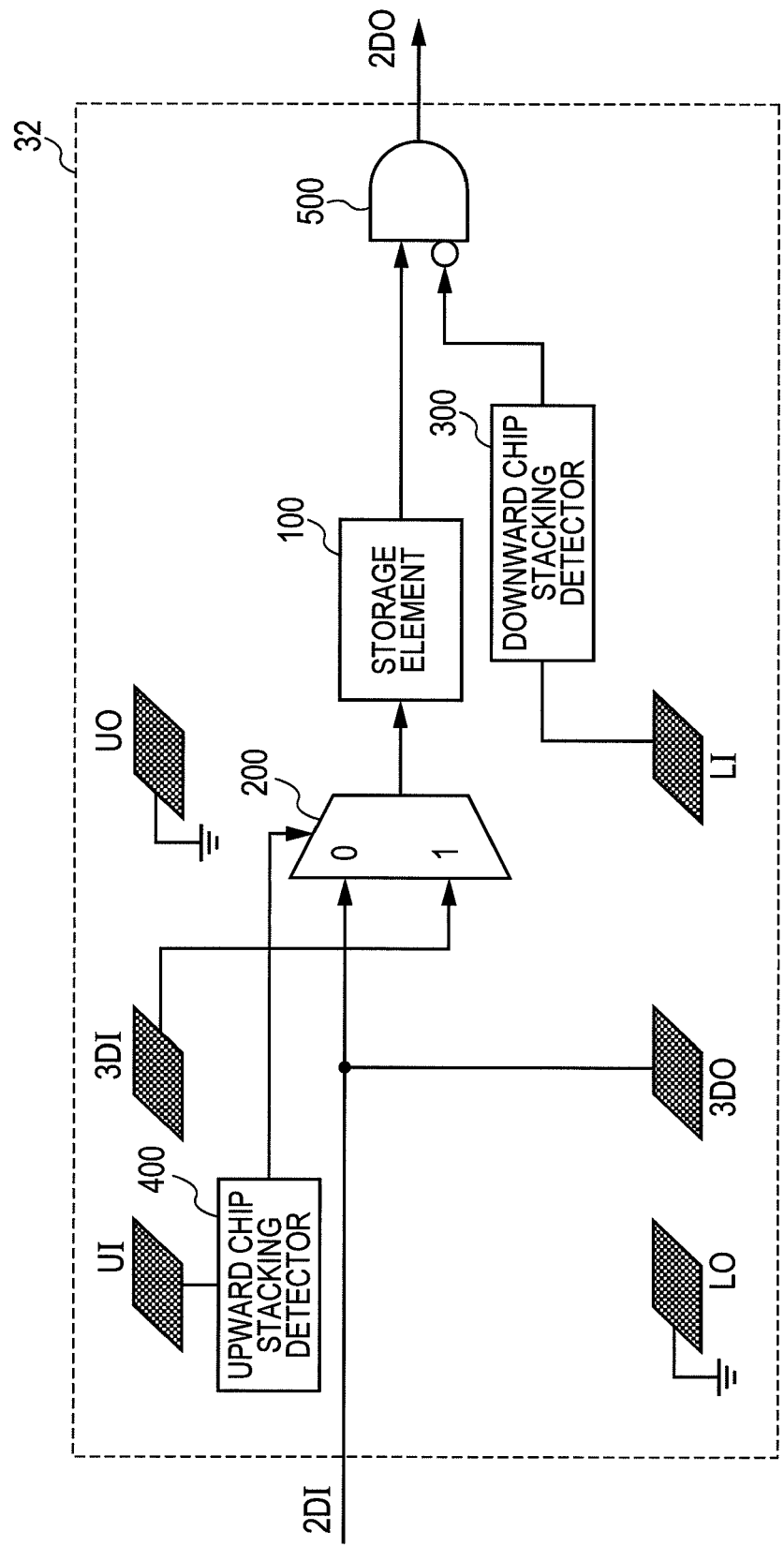
FIG. 4 is a view showing another configuration of the flip-flop with the three-dimensional scan function attached thereto, according to the first embodiment of the invention.

FIG. 4 is a view showing another configuration of the flip-flop with the three-dimensional scan function attached thereto, according to the first embodiment of the invention, FIG. 4 being comparable to FIG. 3. In FIG. 4, a flip-flop 32 with the three-dimensional scan function attached thereto has a function for fetching a data output from an upward-stacked chip as the data input of the scan chain. In FIG. 4, parts corresponding to those in FIG. 3 are denoted by liker reference numerals, respectively, thereby omitting repeated description in detail.

The flip-flop 32 with the three-dimensional scan function attached thereto, shown FIG. 4, differs from the flip-flop 31 with the three-dimensional scan function attached thereto, shown in FIG. 3, in the following respects, more specifically, in that firstly 3DI is an electrode to which a signal is inputted from an upward chip stacking direction while 3DO is an electrode to which a signal is inputted from a downward chip stacking direction, secondly, the selector 200 has a function for selecting data to be inputted to the storage element 100 from the two-dimensional data input terminal 2DI or the three-dimensional scan input terminal 3DI in response to a control signal from the upward chip stacking detector 400 and thirdly, the output control AND gate 500 has a function for outputting AND of a reversed value of a control signal output from the downward chip stacking detector 300, and an output of the storage element 100.

As a result, if no chip is present in the upper layer, the two-dimensional data input terminal 2DI is inputted to the storage element 100, and if a chip is present in the upper layer, the three-dimensional scan input terminal 3DI is inputted to the storage element 100. Further, the flip-flop 32 with the three-dimensional scan function attached thereto delivers the output of the storage element 100 if no chip is present in the lower layer while outputting "0" at all times if a chip is present in the lower layer.

Figure 1:
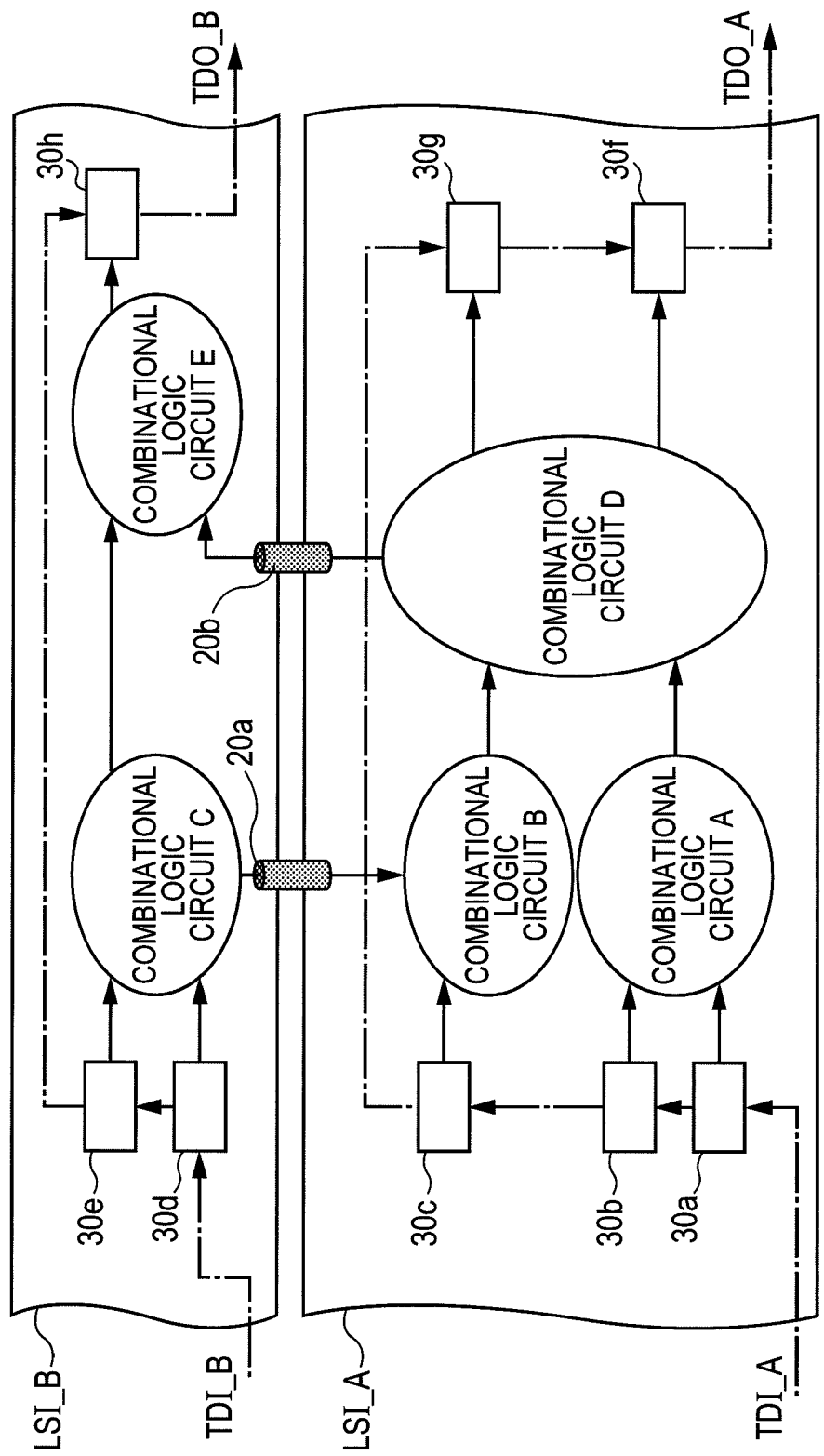
FIG. 1 is a view showing an example of a configuration of a three-dimensional logic circuit comprised of a plurality of LSI chips.
Figure 5:
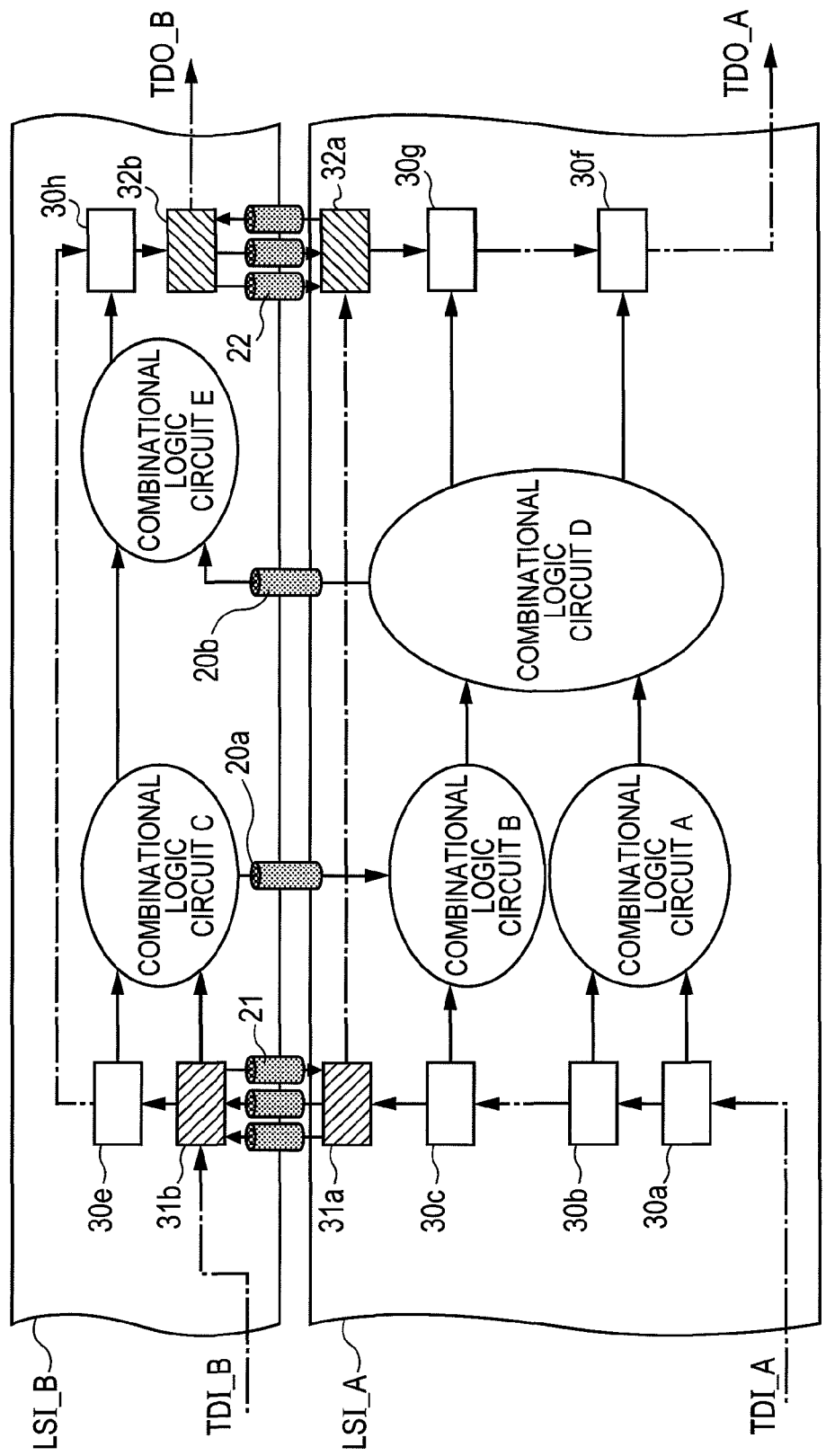
FIG. 5 is a view showing one form of a test circuit according to the first embodiment of the invention.

FIG. 5 shows one embodiment of a test circuit of the invention, using the flip-flops 31, 32 with the three-dimensional scan, function attached thereto, respectively, according to the first embodiment of the invention, FIG. 5 being a view comparable to FIG. 1. In FIG. 5, parts corresponding to those in FIG. 1 are denoted by liker reference numerals, respectively, thereby omitting repeated description in detail.

A logic circuit shown in FIG. 5 differs from a test circuit in FIG. 1, in the following respects, more specifically, in that firstly, the flip-flops 31a, 32a, with the three-dimensional scan function attached thereto, respectively, are inserted in a scan chain extending from the flip-flop 30c to the flip-flop 30g on the LSI_A, secondly, the flip-flop 31b with the three-dimensional scan function thereto is substituted for the flip-flop 30d on the LSI_B, while the lip-flop 32b with the three-dimensional scan function attached thereto is inserted in the back stage of the flip-flop 30h, and thirdly, communication between the flip-flops 31a, 31b as well as communication between the flip-flops 32a, 32b is executed via TSVs 21, 22, respectively, between LSI_A and LSI_B.

Figure 6:
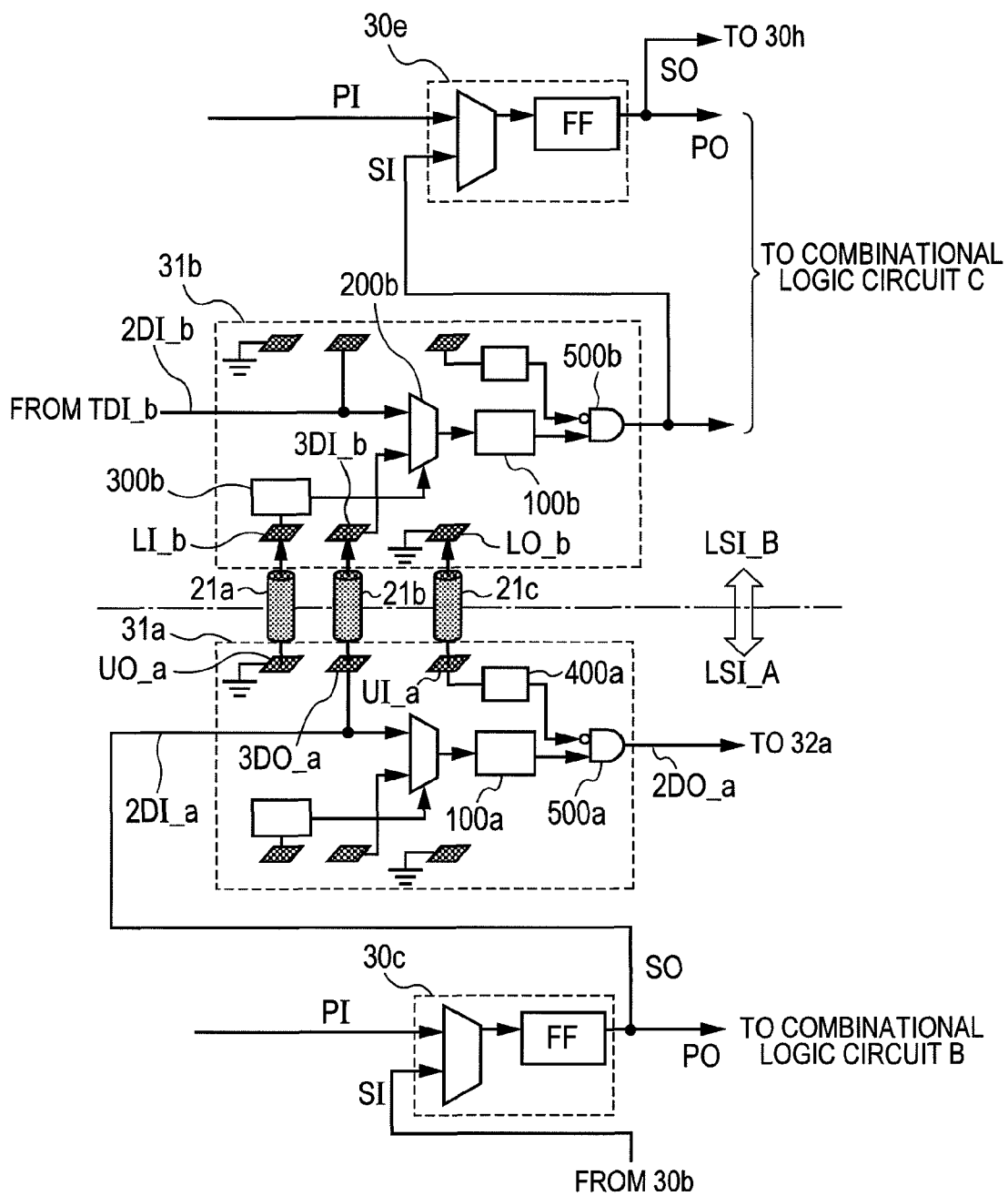
FIG. 6 is a view showing a specific configuration of a scan chain according to the first embodiment of the invention.

FIG. 6 is a view showing a specific configuration of connection among the flip-flop 30c, the flip-flops 31a, 31b, with the three-dimensional scan function attached thereto, respectively, and the flip-flop 30e, shown in FIG. 5.

In FIG. 6, there is shown the case where LSI_A is three-dimensionally connected to LSI_B through the intermediary of the TSVs 21a to 21c; however, there are described hereinafter a scan chain in the case of the respective chips being on their own, and a scan chain in the case where LSI_A is three-dimensionally connected to LSI_B, respectively.

First, with the scan chain on an LSI_A that is not three-dimensionally connected to LSI_B, a scan output from the flip-flop 30b is inputted to the scan input terminal SI of the flip-flop 30c, and a scan output terminal SO of the flip-flop 30c is inputted to the two-dimensional data input terminal 2DI_a of the flip-flop 31a with the three-dimensional scan function attached thereto. Because stacked chips are not present in an upper layer of the LSI_A, a two-dimensional data input is inputted to a storage element 100a. Further, since the case where stacked chips are not present in an upper layer of, the LSI_A either is taken into consideration, an upper layer input UI is in open state, so that the contents of the storage element 100a as a two-dimensional data output 2DO_a is inputted from an output control AND gate 500a to a flip-flop 32a with the three-dimensional scan function attached thereto.

On the other hand, with the scan chain on an LSI_B that is not three-dimensionally connected, data inputted from the test data input terminal TDI_a is inputted to a two-dimensional data input terminal 2DI_b of a flip-flop 31b with the three-dimensional scan function thereto. Herein, since the case where stacked chips are not present in a lower layer is assumed, the data inputted from 2DI_b is delivered to a storage element 100b. Further, since the stacked chips are not present in the upper layer of the LSI_B, the contents of the storage element 100b are outputted from an output control AND gate 500b to be connected to the scan input terminal SI of the flip-flop 30e.

Thus, with the present embodiment, in the case where the LSI_A is not three-dimensionally connected to the LSI_B, a scan chain is made up so as to extend via the flip-flop 30b, the flip-flop 30c, the flip-flop 31a with the three-dimensional scan function attached thereto, the flip-flop 32a with the three-dimensional scan function attached thereto in this order on the LSI_A while a scan chain is made up so as to extend via the flip-flop 31b with the three-dimensional scan function thereto, the flip-flop 30e, and the flip-flop 30h in this order on the LSI_B.

Next, there is described hereinafter a scan chain in the case where LSI_A is three-dimensionally connected to LSI_B.

An upper chip signal output UO_a of the flip-flop 31a with the three-dimensional scan function attached thereto, in the LSI_A, is connected to a lower chip signal input LI_b of the flip-flop 31b with the three-dimensional scan function thereto in the LSI_B via the TSV 21a. Accordingly, a predetermined signal outputted from the upper chip signal output UO_a of the LSI_A, that is, a ground potential is given to a downward chip stacking detector 300b of the flip-flop 31b with the three-dimensional scan function thereto, so that "1" is inputted to a selector 200b, and a signal from a three-dimensional scan input terminal 3DI_b is inputted to a storage element 100b of the flip-flop 31b with the three-dimensional scan function thereto.

Herein, a three-dimensional scan output 3DO_a of the flip-flop 31a with the three-dimensional scan function attached thereto on the LSI_A is connected to the three-dimensional scan input terminal 3DI_b via the TSV 21b, and a signal identical in species to a two-dimensional data input terminal 2DI_a of the flip-flop 31a with the three-dimensional scan function attached thereto is outputted to 3DO_a. More specifically, the scan output SO of the flip-flop 30c is stored into the storage element 100b of the flip-flop 31b with the three-dimensional scan function thereto via both the two-dimensional data input 2DI_a, and 3DO_a of the flip-flop 31a with the three-dimensional scan function attached thereto, the TSV 21b, both the three-dimensional scan input 3DI_b, and the selector 200b of the flip-flop 31b with the three-dimensional scan function thereto.

A lower chip signal output LO_b of the flip-flop 31b with the three-dimensional scan function thereto in the LSI_B is connected to an upper chip signal input UI_a via the TSV 21c. That is, a predetermined signal outputted from the lower chip signal output LO_b of the LSI_B, that is, the ground reference potential in the case of the present embodiment, is given to an upward chip stacking detector 400a of the flip-flop 31a with the three-dimensional scan function attached thereto, so that "0" is outputted from an output control AND gate 500a of the flip-flop 31a with the three-dimensional scan function attached thereto at all times.

Thus, with the present embodiment of the invention, in the case where LSI_A is three-dimensionally connected to LSI_B, a scan chain is made up across the LSI_A and the LSI_B so as to extend via the flip-flop 30b, the flip-flop 30c, the flip-flop 31b with the three-dimensional scan function attached thereto, the flip-flop 30e, the flip-flop 30h in this order. The flip-flop 31a with the three-dimensional scan function attached thereto is skipped over, and an output of flip-flop 31a with the three-dimensional scan function attached thereto is "0" at all times.

Figure 7:
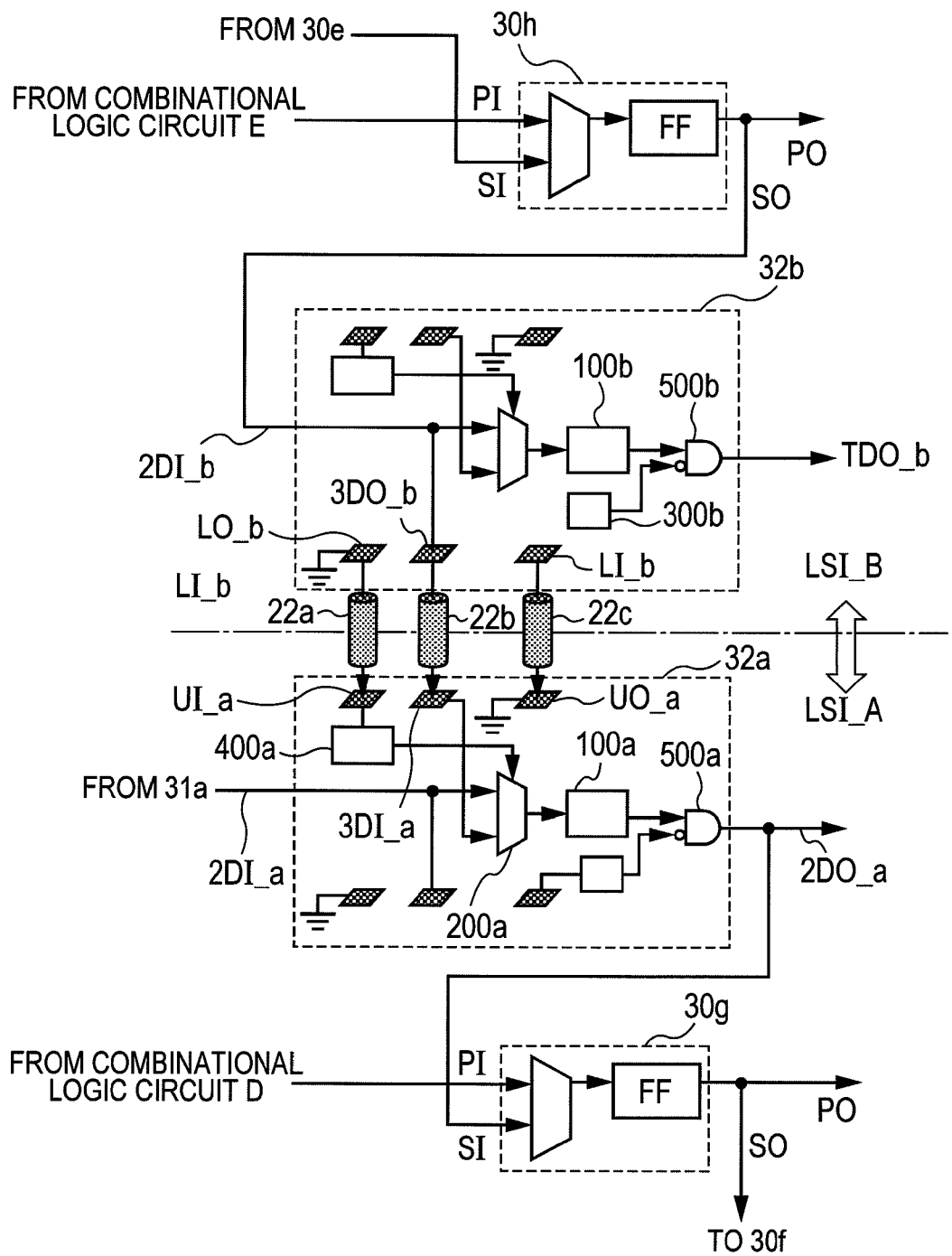
FIG. 7 is view showing a specific configuration of a can chain according to the first embodiment of the invention.

FIG. 7 is view showing a specific configuration of a can chain extended via the flip-flop 30h, the flip-flops 32a, 32b, with the three-dimensional scan function attached thereto, respectively, and the flip-flop 30g, in FIG. 5.

In FIG. 7, there is shown the case where LSI_A is three-dimensionally connected to LSI_B through the medium of TSVs 22a to 22c, however, there are described hereinafter a scan chain in the case of the respective chips being on their own, and a scan chain in the case where LSI_A is three-dimensionally connected to LSI_B, respectively.

First, with the scan chain in the case where the LSI_A is not three-dimensionally connected to the LSI_B, a scan output from the flip-flop 31a with the three-dimensional scan function attached thereto is inputted to a two-dimensional data input 2DI_a of a flip-flop 32a with the three-dimensional scan function attached thereto. In this case, because the case where stacked chips are not present in an upper layer is assumed, a two-dimensional data input 2DI_a is inputted to a storage element 100a. Further, since stacked chips are not present in the lower layer of the LSI_A, the contents of the storage element 100a as the two-dimensional data output 2DO_a is inputted from an output control AND gate 500a to a scan input terminal SI of the flip-flop 30g.

On the other hand, with the scan chain in the case where the LSI_B is not three-dimensionally connected to the LSI_A, a scan output from the flip-flop 30e is connected to a scan input terminal SI of the flip-flop 30h, and a scan output SO of the flip-flop 30h is connected to the two-dimensional data input terminal 2DI_b of the flip-flop 32b with the three-dimensional scan function attached thereto. Since stacked chips are not present in the upper layer of the LSI_B, a two-dimensional data input 2DI_b is inputted to a made up of storage element 100b. Further, since the case where stacked chips are not present in a lower layer either is assumed, the lower chip signal input LI_b is in open state, so that the contents of the storage element 100b are outputted from an output control AND gate 500b to a test data output terminal TDO_b.

Thus, with the present embodiment of the invention, in the case where LSI_A is not three-dimensionally connected to LSI_B, a scan chain is made up so as to extend via the flip-flop 31a with the three-dimensional scan function attached thereto, the flip-flop 32a with the three-dimensional scan function attached thereto, and the flip-flop 30g, in this order on the LSI_A, whereas a scan chain is made up so as to extend via the flip-flop 30e, the flip-flop 30h, the flip-flop 32b with the three-dimensional scan function attached thereto in this order on the LSI_B Next, there is described hereinafter a scan chain in the case where LSI_A is three-dimensionally connected to LSI_B.

A lower chip signal output LO_b of the flip-flop 32b with the three-dimensional scan function thereto on the LSI_B is connected to an upper chip signal input UI_a of the flip-flop 32a with the three-dimensional scan function thereto in the LSI_A via TSV 22a. Accordingly, a predetermined signal outputted from the lower chip signal output LO_b of the LSI_B, that is, the ground reference potential is given to an upward chip stacking detector 400a of the flip-flop 32a with the three-dimensional scan function attached thereto, so that "1" is inputted to a selector 200a, and a signal from a three-dimensional scan input terminal 3DI_a to a storage element 100a of the flip-flop 32a with the three-dimensional scan function attached thereto. Herein, a three-dimensional scan output 3DO_b of the flip-flop 32b with the three-dimensional scan function attached thereto on the LSI_B is connected to the three-dimensional scan input 3DI_a via TSV 22b, and a signal identical to a two-dimensional data input 2DI_b of the flip-flop 32b with the three-dimensional scan function attached thereto is delivered to 3DO_b. More specifically, a scan output SO from the flip-flop 30h is stored in the storage element 100a of the flip-flop 32a via the two-dimensional data input 2DI_b, the three-dimensional data output 3DO_b of the flip-flop 32b with the three-dimensional scan function attached thereto, and the TSV 22b, the three-dimensional scan input 3DI_a of the flip-flop 32a with the three-dimensional scan function attached thereto, and the selector 200a.

The upper chip signal output UO_a of, the flip-flop 32a with the three-dimensional scan function attached thereto in the LSI_A is connected to the lower chip signal input LI_b of the flip-flop 32b with the three=dimensional scan function thereto in the LSI_B via the TSV 22c. More specifically, predetermined signal outputted from the upper chip signal output UO_a of the LSI_A, that is, the ground potential in the case of the present embodiment is given to an upward chip stacking detector 400a of the flip-flop 32b with the three-dimensional scan function attached thereto, so that "0" is outputted from an output control AND gate 500b of the flip-flop 32b with the three-dimensional scan function attached thereto at all times.

Thus, with the present embodiment, in the case where LSI_A is three-dimensionally connected to LSI_B, a scan chain is made up across the LSI_A and the LSI_B so as to extend via the flip-flop 30e, the flip-flop 30h, the flip-flop 32a with the three-dimensional scan function attached thereto, the flip-flop 32e, the flip-flop 30g in this order. The flip-flop 32b with the three-dimensional scan function attached thereto is skipped over, and an output of flip-flop 32b with the three-dimensional scan function attached thereto is "0" at all times.

As described above, the test circuit according to the present embodiment is characterized in that the scan chain can be switched over between the case where the LSI_A is not connected with the LSI_B, and the case where the LSI_A is connected with the LSI_B.

As a result, a partial function test on a predetermined logic circuit is conducted with respect to LSI_A, LSI_B, respectively, before stacking, thereby enabling a comprehensive function test on the logic circuit to be carried out after the stacking.

Accordingly, all the function tests on a logic circuit built across plural chips can be easily conducted without controlling a complex test pattern.

That is, to describe the function test with reference to FIG. 5, in a scan test on LSI_A on its own before the stacking, there are carried out a function test on the combinational logic circuit A as a whole, and a first test on respective parts of the combinational logic circuits B, D, that is, the parts of which communication with LSI_B is not required while, in a scan test on LSI_B on its own, a function test on the combinational logic circuit C as a whole, and a second function test on part of the combinational logic circuit C, that is, the part of which the communication with LSI_A is not required. Then, a third function test can be conducted on the combinational logic circuits B, D, and E, respectively, after the stacking.

The purpose of conducting the function tests by switching a test path between before, and after the stacking is to improve yield of the stacked LSIs as a whole by adopting a method whereby the first function test, and the second function test are carried out, for example, in a wafer stage at the time of manufacturing an LSI chip, before the stacking, and a defective LSI chip is screened at a point in time for processing before the stacking to be followed by application of a process for stacking LSI chips with each other.

Besides the above, in some instances, LSI_B is made up, for example, as an LSI chip having a function for adding a special additional function to LSI_A, while the LSI_A on its own is made up as an LSI chip having an independent function. Naturally, the third function test is longer in test time required as compared with the first function test, or the second function test In this case, it is possible to conduct various tests on circuit configurations identical to each other, the tests differing from each other on a product-by-product basis, the various tests including the first function test to be carried out in the case where the LSI_A on its own is a product, and the third function test to be carried out in the case where a product is made up by stacking the LSI_A, the LSI_B each other.

With the test circuit shown in FIG. 5, in the case of the third function test, the scan chain is made up to extent from the LSI_A to the LSI_B, and from the LSI_B to the LSI_A in this d order, however, an order relation between the LSI_A and the LSI_B does not pose any essential problem. That is, the main effect of the present invention lies in that setting as well as observation of test data via the san chain can be carried out concurrently with respect to the LSI_A and the LSI_B.

Figure 8:
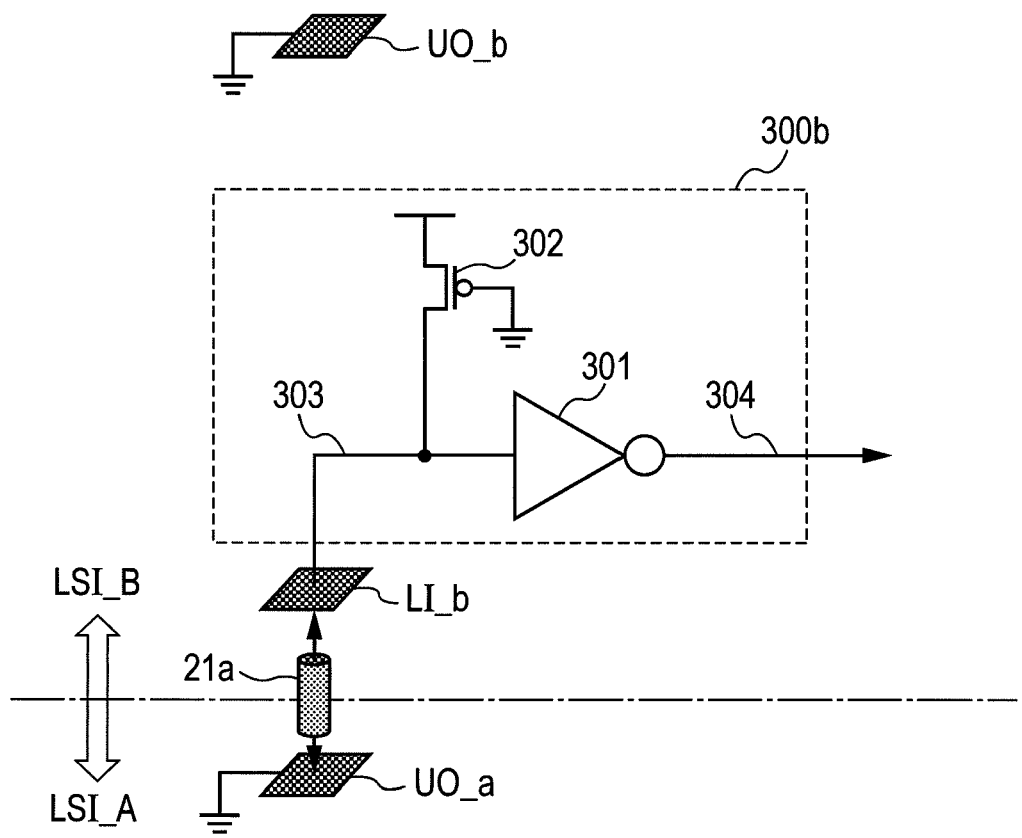
FIG. 8 shows a specific configuration of a downward chip stacking detector 300b by way of example.

FIG. 8 shows a specific configuration of the downward chip stacking detector 300b of the flip-flop 31b with the three-dimensional scan function attached thereto on the LSI_B in FIG. 6 by way of example.

In FIG. 8, 300b is the downward chip stacking detector, reference numeral 301 denotes an inverter logic gate, and reference numeral 302 is a pull-up resistor comprised of a PMOS transistor of a predetermined size. LI_b is an electrode for receiving a signal from the underside direction of the LSI_B, serving as the terminal for an input from the lower chip of the flip-flop 31b with the three-dimensional scan function attached thereto, UO_b is an electrode for outputting a signal upward of the LSI_B, serving as the terminal for an output to the upper chip in the flip-flop 31b with the three-dimensional scan function attached thereto, and UO_a is an electrode for outputting a signal upward of the LSI_A, serving as the terminal for an output to the upper chip in the flip-flop 31a with the three-dimensional scan function attached thereto while 21a is the TSV for electrically connecting LI_b to UO_a.

In FIG. 8, there is depicted the case where LI_b is three-dimensionally connected to UO_a through the intermediary of the TSV 21a, however, operations in the case where LI_b is not three-dimensionally connected to UO_a, and in the case LI_b is three-dimensionally-connected to UO_a, respectively, are described hereinafter.

First, in the case of the absence of the three-dimensional connection, none is connected to the electrode LI_b on the LSI_B, and the electrode LI_b is therefore in the open state, so that a potential at an input node 303 of the inverter logic gate 301 is raised to a power supply potential by the pull-up resistor 302, that is, the potential will be at a signal "1". Accordingly, an output of the inverter logic gate 301 will be at a signal "0". Then, in the case of the presence of the three-dimensional connection, the electrode UOa is connected to the electrode LI_b on the LSI_B via the TSV 21a. A predetermined signal, that is, the ground potential has been given to UO_a in FIG. 8. In this case, assuming that the power supply potential is Vcc, a resistance value of the pull-up resistor 302 is Rmos, and a resistance value of the TSV 21a is Rtsv, a potential Vin of the input node 303 is expressed by the following formula:

$$Vin = Vcc * Rtsv / (Rtsv + Rmos)$$

If the resistance value Rmos of the pull-up resistor 302 is designed to be sufficiently large in comparison with the resistance value Rtsv of the TSV 21a, Vin 0 can be assumed. More specifically, the input node 303 will be at a signal "0", and the output of the inverter logic gate 301 will be at a signal "1".

Thus, the downward chip stacking detector 300b according to the present embodiment is connected to the electrode LI_b, and is also connected to a selector 200 via an interconnection 304. The downward chip stacking detector 300b is characterized in that if stacked layers are not present in the lower layer of the LSI_B, the signal "0" is outputted without control from outside, and if stacked layers are present in the lower layer of the LSI_B, the signal "1" is outputted without control from outside. With the adoption of the configuration described as above, switchover of the selector can be realized according to the presence or absence of the stacked layers.

Further, the downward chip stacking detector 300b is characterized in that circuits (the inverter logic gate 301, and so forth) for controlling the selector are provided, and a first potential is supplied to the input (terminal) of the control circuit via a resistor while the input (terminal) is connected to the electrode LI_b as the configuration for enabling the signals "0", and "1" to be outputted. With the adoption of the circuit, in the case where the electrode LI_b is connected to other semiconductor chip, a second potential from the other semiconductor chip is inputted to the control circuit, thereby enabling outputting of the signals "0", and "1" to be realized.

Figure 9:
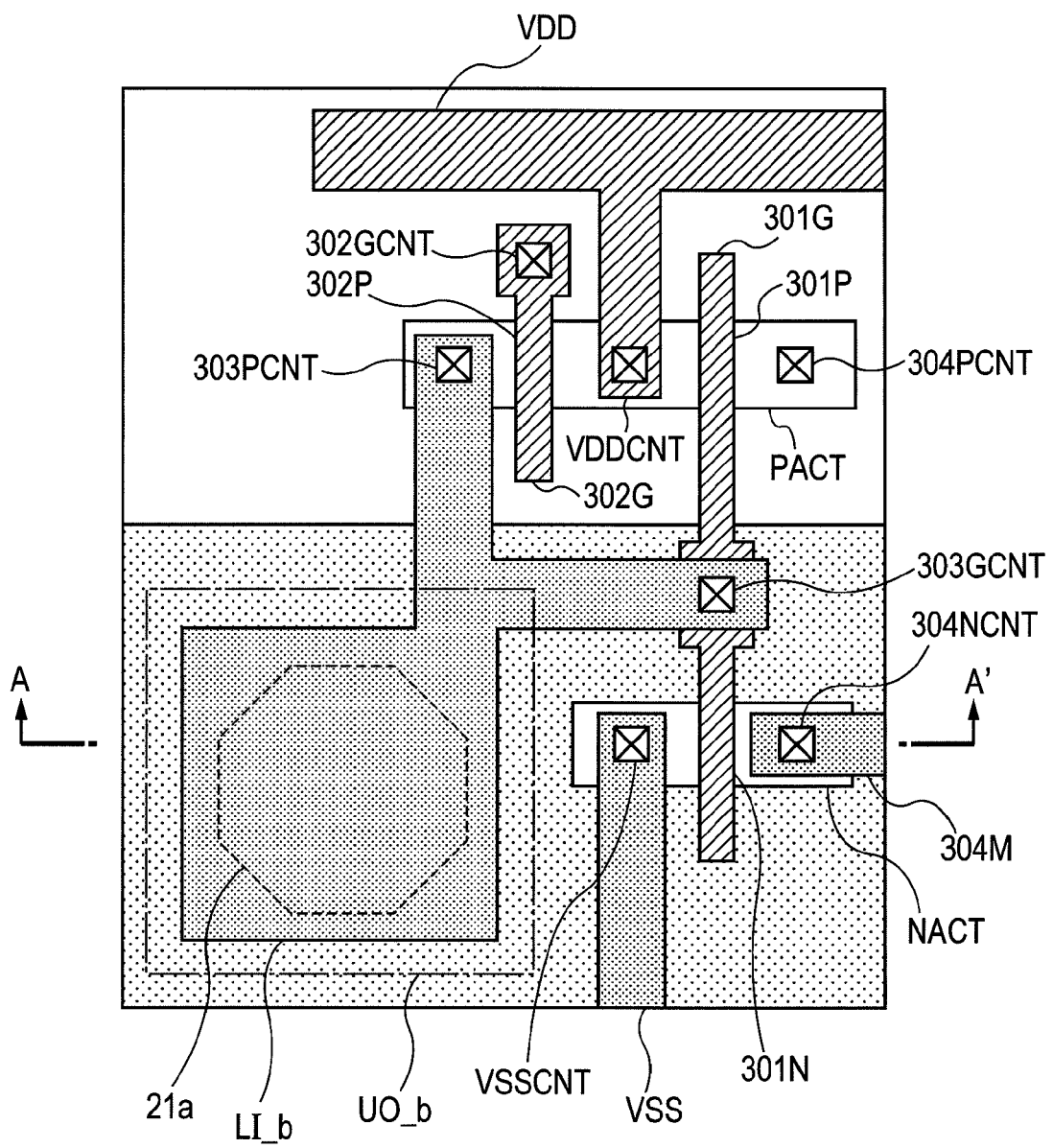
FIG. 9 shows one example of a specific configuration with reference to a layout pattern of the downward chip stacking detector 300b of FIG. 8.

FIG. 9 shows one example of a specific configuration with reference to a layout pattern of the downward chip stacking detector 300b of FIG. 8.

Normally, the layout pattern of an LSI includes a multitude of diffusion layers, and metal layers, however, in FIG. 9, there are shown only the layout pattern of the main diffusion layer, and the layout pattern of the lowermost metal layer (hereinafter referred to as a first metal layer) for the sake of simplicity.

In FIG. 9, PACT denotes a p-diffusion layer, NACT an n-diffusion layer, VDD a metal structure in the first metal layer, for supplying a power supply voltage, VDDCNT a contact for giving the power supply voltage to PACT, VSS a metal structure in the first metal layer, for supplying the ground reference voltage, and VSSCNT a contact for giving the ground reference voltage to NACT. 301G denotes a gate terminal of the inverter logic gate 301 in FIG. 8, a portion of the 301G, overlapping PACT, is a PMOS transistor 301P for making up the inverter logic gate, and a portion of the 301G, overlapping NACT, is an NMOS transistor 301N for making up the inverter logic gate. 302G is a gate terminal of the pull-up resistor 302 in FIG. 8, and a portion of the 302G, overlapping PACT, is a PMOS transistor 302P. Further, the ground reference voltage is given by metal layers (not shown) differing from each other to 302GCNT that is a contact connected the gate terminal 302G. 304PCNT denotes is a contact connected to a drain terminal of 301P, 304 NCNT is a contact connected to a drain terminal of 301N, and 304PCNT and 304 NCNT, electrically connected with each other by metal layers (not shown) differing from each other, together with 304M (the interconnection 304), make up an output terminal of the inverter logic gate 301.

The lower chip signal input terminal LI_b in FIG. 8 is the metal structure made up in the first metal layer, formed in a shape of a combination of a square with a shape resembling the letter L, LI_b being electrically connected to contacts 302G, 301G, respectively, through 303PCNT, and 303GCNT, respectively. The upper chip signal output UO_b (UO_a) in FIG. 8, corresponds to a square indicated by a dash and dotted line in FIG. 9, representing a metal structure made up in the uppermost metal layer, and the ground reference voltage is given thereto by use of another metal layer (not shown). The TSV 21a in FIG. 8 corresponds to an octagon indicated by a dotted line in FIG. 9, and is made up in a direction penetrating through a silicon substrate toward a layer lower than the lower chip signal input terminal LI_b, the TSV 21a being electrically connected to the lower chip signal input terminal LI_b.

Figure 10:
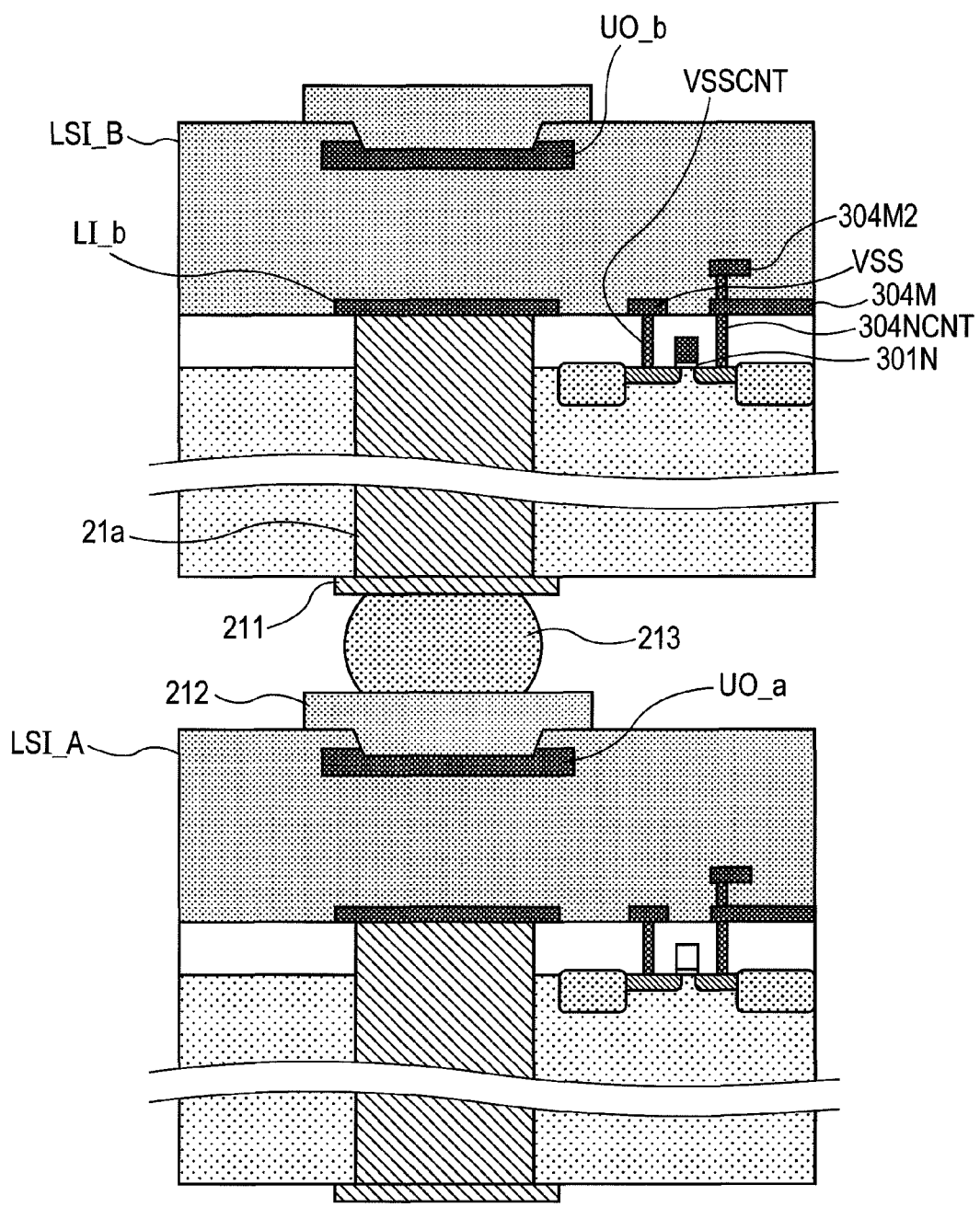
FIG. 10 is a schematic representation showing a structure of connection between LSI_A and LSI_B, in a sectional configuration taken along a dotted line A-A' in FIG. 9.

FIG. 10 is a schematic representation showing a structure of connection between LSI_A and LSI_B, in a sectional configuration taken along a dotted line A-A' in FIG. 9. In FIG. 10, parts corresponding to those in FIG. 9 are denoted by like reference numerals. Configurations Identical to each other, that is, the downward chip stacking detectors 300b are laid out at respective positions, identical to each other, as seen in a stacking direction, in the LSI_B, and the LSI_A, respectively, in FIG. 10, although reference numerals are not depicted in detail in FIG. 10. In actuality, there can be the case where the downward chip stacking detectors 300b, are not at the positions completely identical to each other due to a processing problem, however, at least a part of the electrode UO_a is disposed at a position identical to the position of the electrode LI_b, more, specifically, at a vertically upward position thereof, or downward position thereof. With the adoption of the configuration described as above, in the case where plural chips identical in circuit configuration are stacked one another, it is possible to normally operate stacking detectors (the downward chip stacking detector, and the upward chip stacking detector).

In FIG. 10, 21a denotes the TSV shown in FIGS. 8 and 9, connected to the lower chip signal input terminal LI_b, and the TSV 21a is made up by boring a hole in the direction penetrating through the silicon substrate toward the layer lower than the LI_b, and filling the hole up with a conductive substance. Reference numeral 211 denotes an electrode pad electrically connected to the TSV 21a to be exposed to the underside of the LSI_B. Reference numeral 212 denotes an electrode pad electrically connected to the upper chip signal output UO_a of the LSI_A, being made up so as to be exposed to the upper surface of the LSI_A. Reference numeral 213 denotes a micro bump for electrically connecting the electrode pad 211 to the electrode pad 212.

Thus, the downward chip stacking detector 300 according to the present embodiment is characterized in that the electrode UO at the output terminal for the upper chip, in the LSI_A, and the input terminal LI for a signal from the lower chip, in the LSI_B, are at the respective positions identical to each other, as seen in the stacking direction, so that LI and UO are electrically connected to each other simply by stacking the LSI_B, and the LSI_A each other. Similarly, as for a relationship between the three-dimensional scan input terminal 3DI and the three-dimensional scan output terminal 3DO as well as between the output terminal LO for a signal to the lower chip and the input terminal UI for a signal from the upper chip, the relevant electrodes are at the respective positions identical to each other, as seen in the stacking direction, so that the present embodiment is characterized in that these electrodes are electrically connected to each other simply by stacking the LSI_B, and the LSI_A each other.

As a result, a test circuit can be made up by disposing three-dimensional scan flip-flops 31 identical in layout pattern to each other at respective positions, identical to each other, as seen in a stacking direction, in the LSI_B, and the LSI_A, respectively. More specifically, it is unnecessary at the time of LSI designing to design a circuitry for a three-dimensional scan test in such a way as to match the respective chips, and it need only be sufficient to mechanically dispose the chips at the respective positions, identical to each other. By so doing, reduction in test circuit design cost for three-dimensional LSIs.

Figure 11:
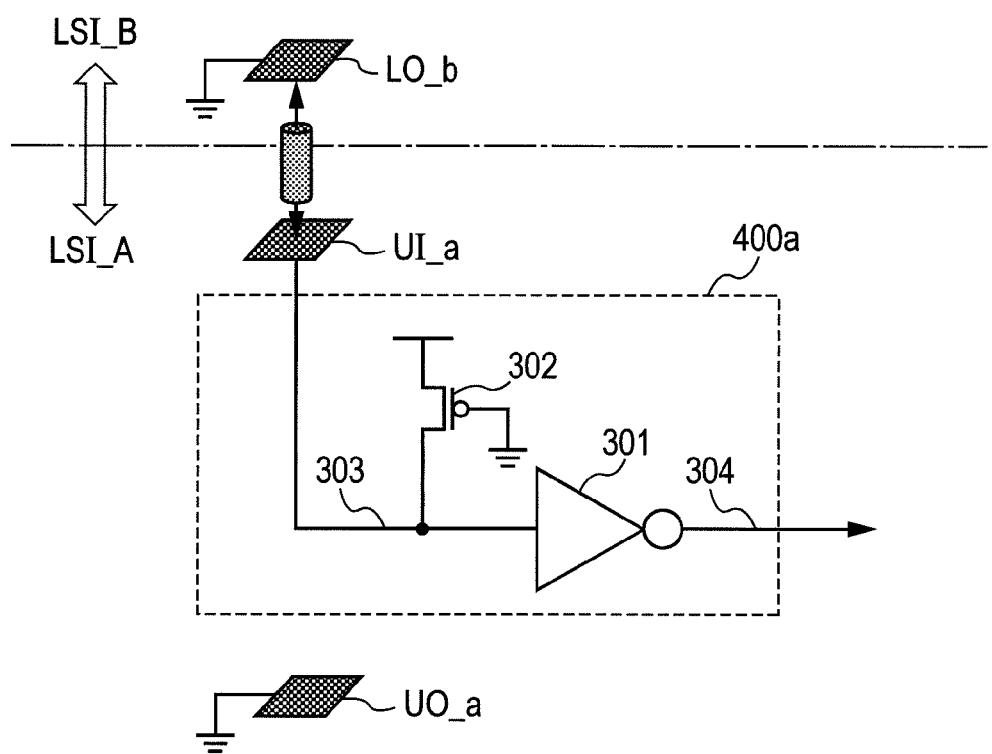
FIG. 11 shows one example of a specific configuration of an upward chip stacking detector 400.

FIG. 11 shows one example of a specific configuration of the upward chip stacking detector 400a of the flip-flop 31a with the three-dimensional scan function attached thereto in the LSI_A of FIG. 6, the configuration being comparable to that of the downward chip stacking detector 300b of FIG. 8. Further, with reference to the upward chip stacking detector 400a in FIG. 11, constituent elements identical to those of the downward chip stacking detector 300b in FIG. 8 are denoted by like reference numerals, thereby omitting repetition in detailed description.

As is evident in comparison FIG. 11 with FIG. 8, a difference between the upward chip stacking detector 400a of FIG. 11 and the downward chip stacking detector 300b of FIG. 8 lies in that the LI_b in the LSI_B of FIG. 8 is replaced with the UI_a in the LSI_A of FIG. 11, and the UO_a in the LSI_A FIG. 8 is replaced with the LO_b in the LSI_B of FIG. 11. Accordingly, the upward chip stacking detector 400a of FIG. 11 is identical in principle and operation to the downward chip stacking detector 300b of FIG. 8, and needless to say, both the detectors have the same feature.

Similarly, in a layout pattern of the upward chip stacking detector 400a of FIG. 11, as well, the downward signal input LI, and the upward signal output UO, in the respective chips shown in FIGS. 9, 10, are replaced with the upward signal input UI, and the downward signal output LO, respectively, thereby simply interchanging upward with downward with respect to the respective chips, and detailed description with reference to a drawing is therefore omitted.

<Variation>

(1) Another Configuration of a Downward Chip Stacking Detector

Figure 12:
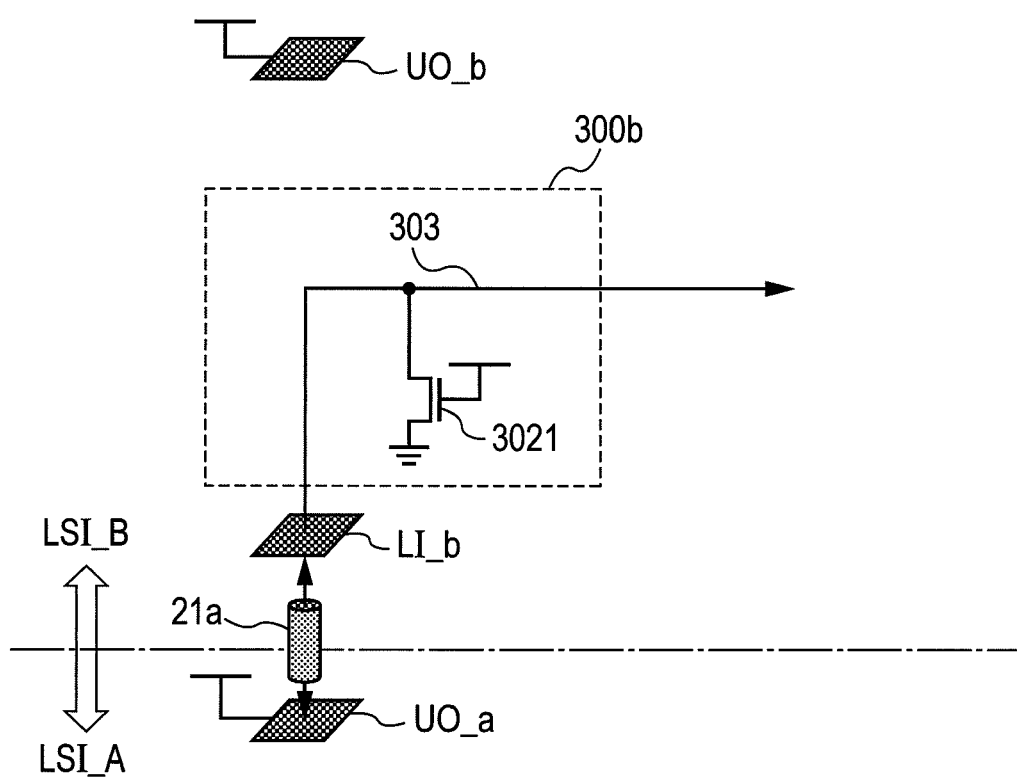
FIG. 12 shows another example of the specific configuration of the downward chip stacking detector 300b.

FIG. 12 shows another example of the specific configuration of the downward chip stacking detector 300b of the flip-flop 31b with the three-dimensional scan function thereto of the LSI_B in FIG. 6, FIG. 12 being comparable to FIG. 8.

The downward chip stacking detector 300b of FIG. 12 differs from the one in FIG. 8 as follows. First, the inverter logic gate 301 of FIG. 8 does not exist in FIG. 12, and a node 303 on its own is an output of the downward chip stacking detector 300b. Further, the pull-up resistor 302 of FIG. 8 is replaced with a pull-down resistor 3021 comprised of an NMOS transistor.

In FIG. 8, the ground potential as the predetermined signal has been given to the upper chip signal outputs UO_a, and UO_b, respectively, whereas the power supply potential as the predetermined signal is given to the UO_a, and UO_b, respectively, in FIG. 12.

In FIG. 12, there is depicted the case where LI_b is three-dimensionally connected to UO_a through the intermediary of the TSV 21a, however, operations in the case where LI_b is not three-dimensionally connected to UO_a, and in the case LI_b is three-dimensionally connected to UO_a, respectively, are described hereinafter.

First, in the case of the absence of the three-dimensional connection, none is connected to the electrode LI_b in the LSI_B, and the electrode LI_b is therefore in the open state, so that a potential at the node 303 is dropped to the ground potential by the pull-down resistor 3021, that is, the potential will be at a signal "0". Then, in the case of the presence of the three-dimensional connection, UO_a is connected to the electrode LI_b on the LSI_B via the TSV 21a. Then, in the case of the presence of the three-dimensional connection, the electrode UO_a is connected to the electrode LI_b on the LSI_B via the TSV 21a. A predetermined signal, that is, the power supply potential in the case of the present embodiment is given to UO_a. In this case, if the resistance value of the pull-down resistor 3021 is designed to be sufficiently large in comparison with the resistance value of the TSV 21a, a potential of the node 303 as well can be assumed at the supply potential, that is, the potential will be at the signal "1".

Thus, an operation of the downward chip stacking detector 300b according to the present variation as well is characterized in that the downward chip stacking detector 300b outputs the signal "0" if stacking does not exist in the lower layer of the LSI_B, outputting the signal "1" if the stacking exists in the lower layer of the LSI_B, as is the case with the downward chip stacking detector 300b of FIG. 8, With the present variation, since a circuit element required of the downward chip stacking detector 300b is the NMOS transistor 3021 only, the downward chip stacking detector 300b has an advantage in that a circuit can be built on a very small scale, but on the other hand, it has a drawback in that if a parasitic capacitance accompanying the node 303 is large, a response speed is low, and susceptible to noise because the node 303 is operated by a driving force of the pull-down resistor 3021 only.

(2) In the Case of not Less than Three Layers

In FIG. 5, there has been described the case where two sheet of the semiconductor ships are stacked each other, however, the present embodiment is not limited thereto, and is applicable to an expansion case where not less than three layers of semiconductor ships are stacked one another.

Figure 13:
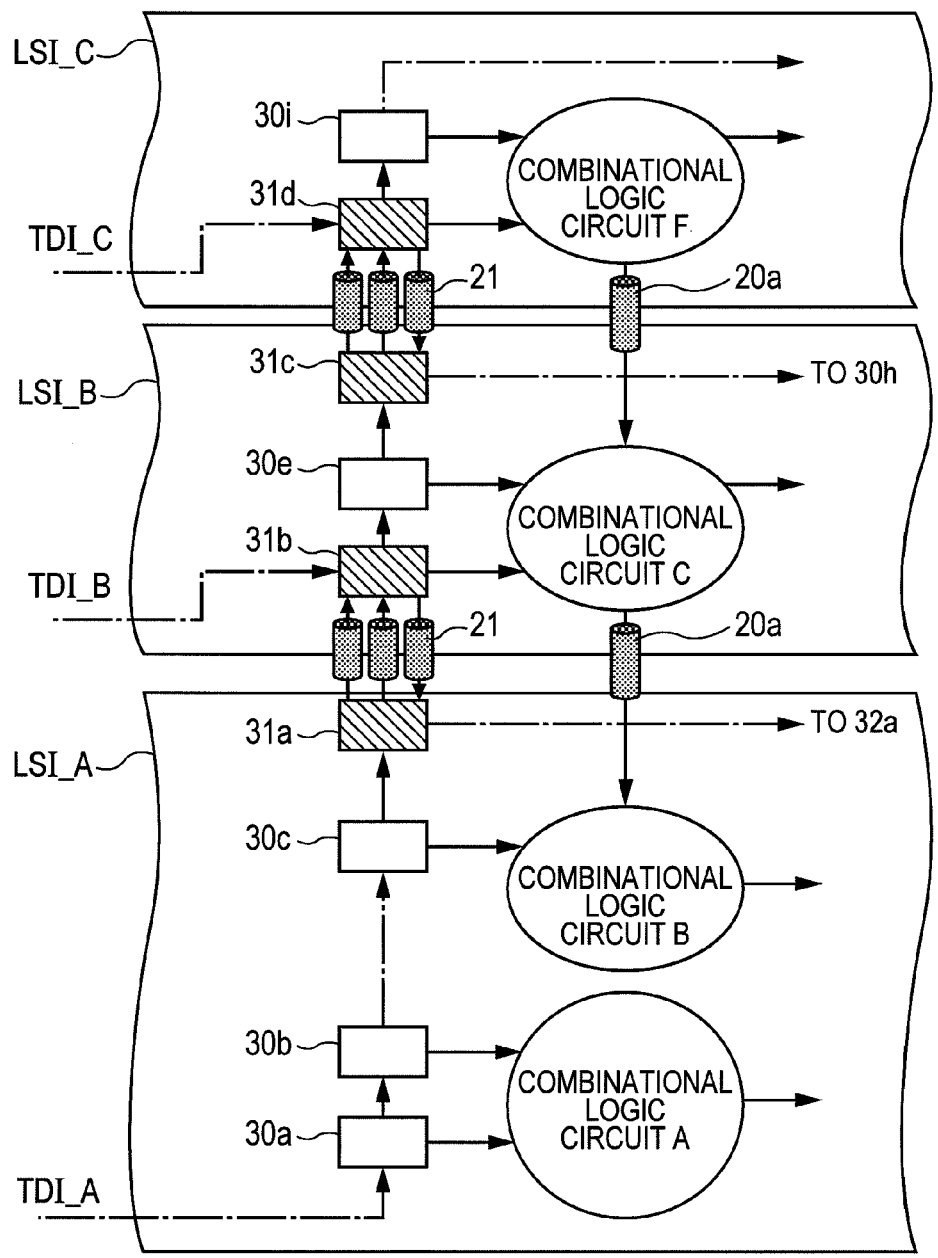
FIG. 13 shows one example of a test circuit configuration according to the first embodiment of the invention, in the case where three layers of semiconductor chips are stacked one another.

FIG. 13 shows one example of a test circuit configuration in the case where three layers of semiconductor chips, LSI_A, LSI_B, and LSI_C, are stacked one another, FIG. 13 being a view comparable to FIG. 5.

In FIG. 13, besides the combinational logic circuits A, B, C, shown in FIG. 5, there is additionally provided a combinational logic circuit F on the LSI_C. The combinational logic circuit C differs in configuration from the one in FIG. 5, receiving a resultant output from the combinational logic circuit F on the LSI_C besides inputs from a flip-flop 30e, and a flip-flop 31b with the three-dimensional scan function thereto, respectively.

In FIG. 13, the LSI_A is identical in configuration to the test circuit in FIG. 5, omitting therefore detailed description. Further, in FIG. 13, the LSI_B differs in configuration from the test circuit in FIG. 5 in that a flip-flop 31d with the three-dimensional scan function thereto is not inserted in a scan chain.

The LSI_C is made up of the flip-flop 31d with the three-dimensional scan function thereto, a flip-flop 30i, and the combinational logic circuit F, and a path extended via the flip-flop 31d with the three-dimensional scan function thereto and the flip-flop 30i, indicated by a dash and dotted line, is a scan chain.

Herein, there is described the case where the respective LSIs are not three-dimensionally connected to each other, and a scan test is conducted on the respective chips on their own.

Since the LSI_A is identical to the one shown in FIG. 5, detailed description is omitted. A scan chain in the LSI_B is a path through which test data inputted from the TDI_B proceeds toward a flip-flop 30h via the flip-flop 31b with the three-dimensional scan function thereto, the flip-flop 30e, and a flip-flop 31c with the three-dimensional scan function thereto in this order. The scan chain in the LSI_C is a path through which test data inputted from the TDI_C proceeds toward the next flip-flop via the flip-flop 31d with the three-dimensional scan function thereto and the flip-flop 30i in this order.

On the other hand, in the case where the respective LSIs are three-dimensionally connected to each other, a scan chain is a path through which data inputted from the TDI_A proceeds toward the next flip-flop via a flip-flop 30a, a flip-flop 30b, the flip-flop 30c, the flip-flop 31b with the three-dimensional scan function thereto, the flip-flop 30e, the flip-flop 31d with the three-dimensional scan function thereto, and the flip-flop 30i in this order, the scan chain skipping over the flip-flops 31a, 31c with the three-dimensional scan function attached thereto, respectively. Further, needless to say, the signal "0" is outputted to the scan chains extended toward the flip-flop 30g, and the flip-flop 30h, respectively.

In FIG. 13, only the scan chain extended from the LSI_B toward the LSI_C at the time of three-dimensional connection is described, however, in the case of a scan chain (not shown) extended from the LSI_C toward the LSI_B, as well, it is obvious that application of the test circuit can be expanded to three-layers of stacked chips by similarly inserting the flip-flop 32 with the three-dimensional scan function attached thereto halfway through the scan chain.

Figure 14:
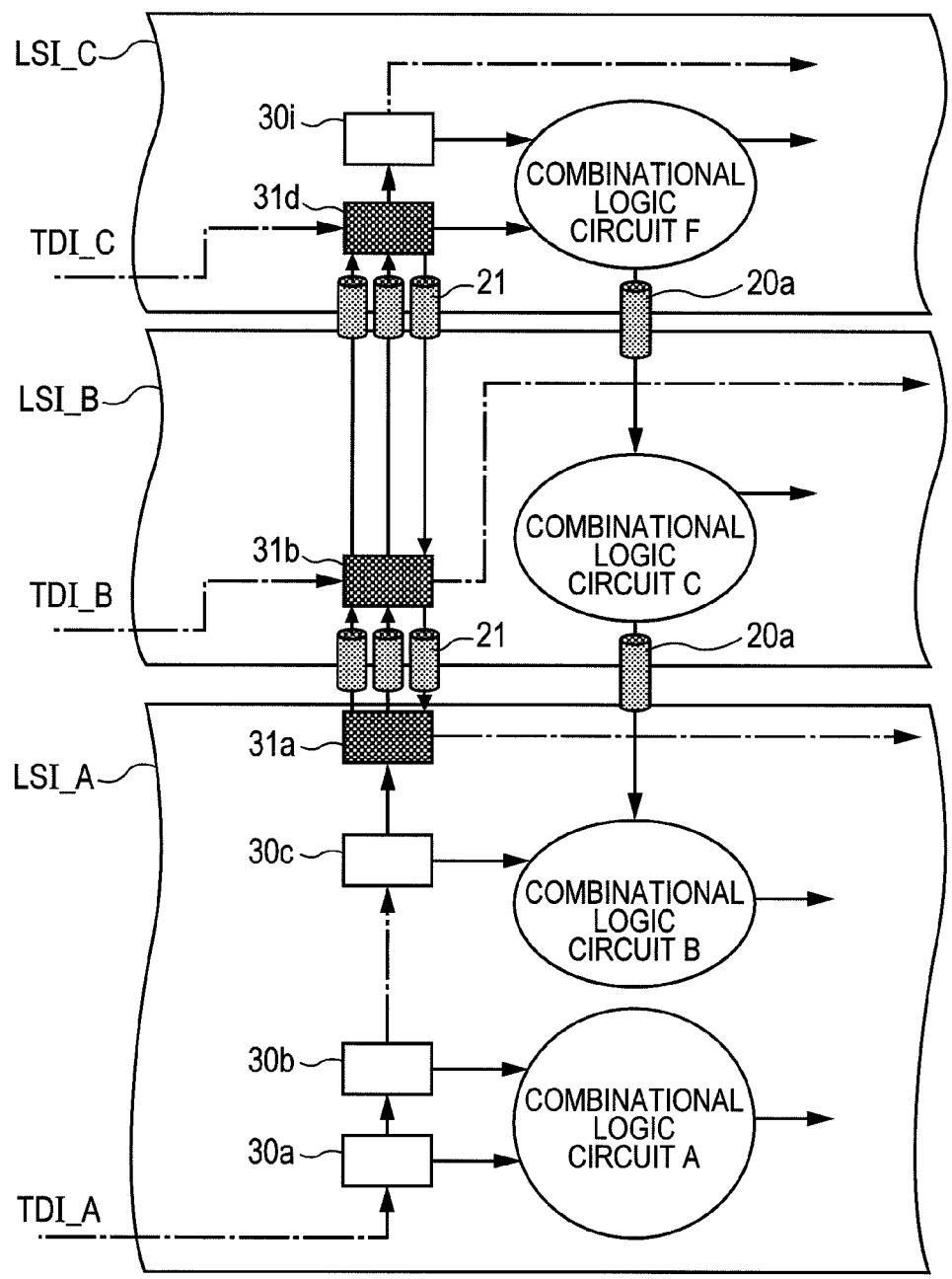
FIG. 14 shows another example of the test circuit configuration according to the first embodiment of the invention, in the case where three layers of semiconductor chips are stacked one another.

However, in FIG. 13, a pair of the flip-flops 31a, 31b with the three-dimensional scan function attached thereto, respectively, and a pair of the flip-flops 31c, 31d with the three-dimensional scan function attached thereto, respectively, are disposed at positions identical to each other in respective chips, as seen in a stacking direction, however, the flip-flops 31b, 31c naturally cannot be disposed at positions identical to each other as seen in a stacking direction. However, as shown in FIG. 14, if, for example, the combinational logic circuit C on the LSI_B receives an input from, combinational logic circuit F on the LSI_C only without receiving an input from any circuit on the LSI_B, the pair of the flip-flops 31a, 31b, and the flip-flop 31d can be disposed at positions identical to each other in respective chips, as seen in a stacking direction, simply by disposing the flip-flop 31b with the three-dimensional scan function thereto on the LSI_B, as depicted in the figure.

Second Embodiment

Figure 15:
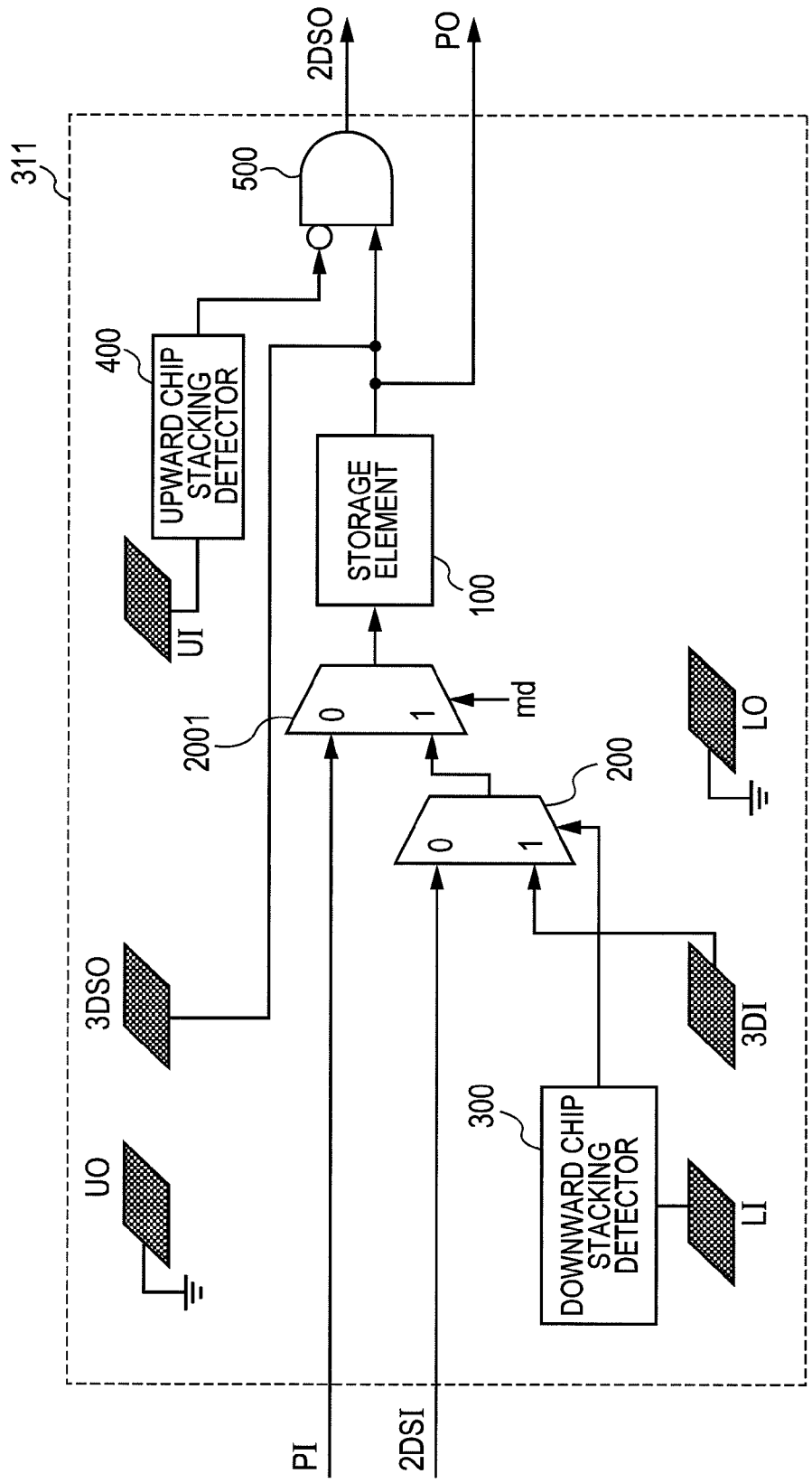
FIG. 15 is a view showing a configuration of a flip-flop with a three-dimensional scan function attached thereto, according to a second embodiment of the invention.

FIG. 15 is a view showing a configuration of a flip-flop with a three-dimensional scan function attached thereto, according to a second embodiment of the invention, FIG. 15 being a view comparable to FIG. 3.

The flip-flop 311 with the three-dimensional scan function attached thereto of FIG. 15 differs from the flip-flop 31 with the three-dimensional scan function attached thereto of FIG. 3 as follows.

An input to a selector 200 includes an input 2DSI from the scan chain on the same chip besides 3DSI as an input from the scan chain of a lower layer chip. A selector 2001 is provided between an output of the selector 200 and a storage element 100. Herein, the other of inputs of the selector 2001 is PI as an input of data from a circuit on the same chip. A mode designation signal and as a control signal of the selector 2001 is inputted to the selector 2001. An output from the storage element 100 bifurcates into 3DO as an output toward an upper chip scan chain, and PO as a data output to a circuit on the same chip before being inputted to an output control AND gate 500.

Subsequently, the flip-flop 311 with the three-dimensional scan function attached thereto of FIG. 15 operates as follows.

The output of the selector 200 is selected from 2DSI or 3DSI in response to a control signal from a downward chip stacking detector 300. More specifically, 2DSI is outputted to the selector 2001 if the control signal from the downward chip stacking detector 300 is "0", and 3DSI is outputted to the selector 2001 if the control signal from the downward chip stacking detector 300 is "1".

The selector 2001 selects data to be inputted to the storage element 100 from data from a data input terminal PI or data from a scan input terminal SI in response to the mode designation signal md. More specifically, if the mode designation signal md is at "0", testing will be in the normal operation mode, and a signal entering from the data input terminal PI is inputted to the storage element 100. On the other hand, if the mode designation signal md is at "1", the testing will be in the scan mode, and a signal outputted from selector 200 is inputted to the storage element 100.

Figure 2:
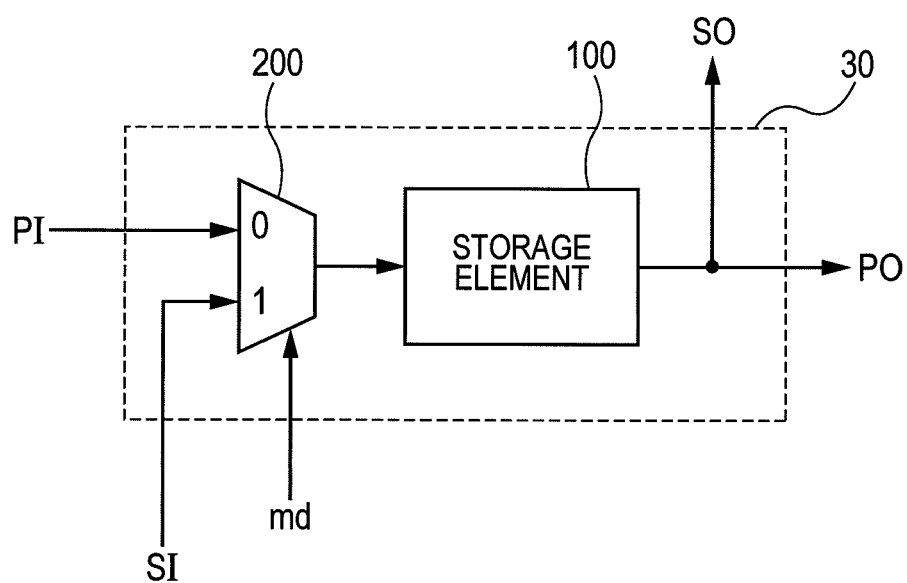
FIG. 2 is a view showing an example of a configuration of a flip-flop 30 with a three-dimensional scan function attached thereto.

Thus, the flip-flop 311 with the three-dimensional scan function attached thereto of FIG. 15 is provided with a function that selection is made between the input 2DSI from the scan chain on the same chip and the input 3DSI from the scan chain of a downward stacked chip in response to whether or not the scan input of the flip-flop 30 with the three-dimensional scan function attached thereto, shown In FIG. 2, is from a downward stacked chip. More specifically, the flip-flop 311 with the three-dimensional scan function attached thereto according to the present embodiment is characterized in that both the scan input/output against the scan chains on the same chip, and the input/output against the scan chains in the stacking direction are provided.

With the flip-flop 32 with the three-dimensional scan function attached thereto shown of FIG. 4, as well, a configuration thereof can be needlessly varied such that selection can be similarly made from the scan inputs on the same chip or inputs of the respective scan chains from the upward stacked chips.

Figure 16:
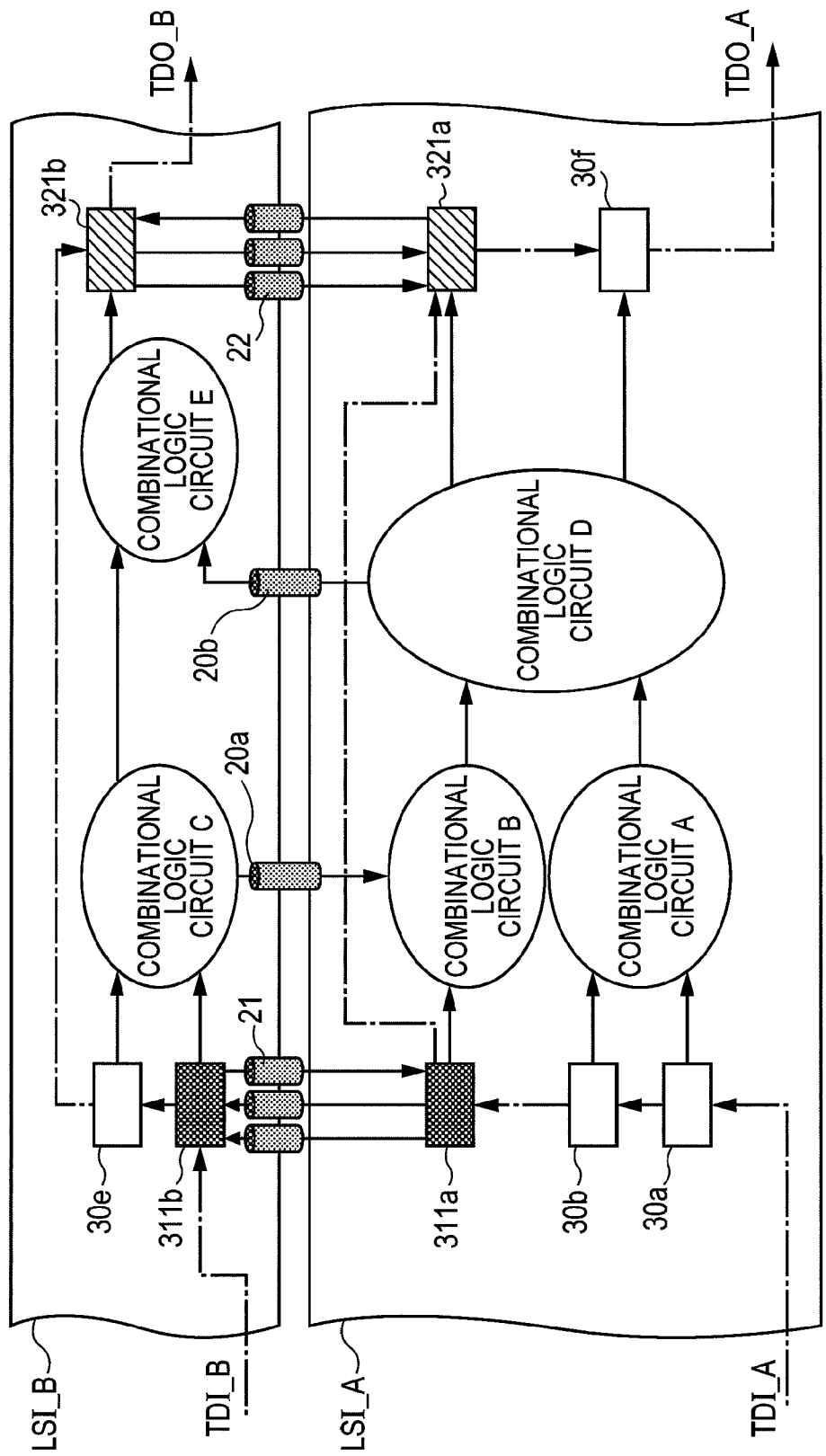
FIG. 16 shows one form of a test circuit of the invention, using a flip-flop with the three-dimensional scan function attached thereto, according to the second embodiment of the invention.

FIG. 16 shows one form of a test circuit of the invention, using a flip-flop with the three-dimensional scan function attached thereto, according to the second embodiment of the invention, FIG. 16 being a view comparable to FIG. 1 and FIG. 5, respectively.

The test circuit shown in FIG. 16 differs from the test circuit in FIG. 1, in the following respects, more specifically, in one respect, the flip-flop 30c is replaced with a flip-flop 311a with the three-dimensional scan function attached thereto, the flip-flop 30d is replaced with a flip-flop 311b with the three-dimensional scan function attached thereto, the flip-flop 30g is replaced with a flip-flop 321a with the three-dimensional scan function attached thereto, and the flip-flop 30h is replaced with a flip-flop 321b with the three-dimensional scan function attached thereto, respectively, and in another respect, three-dimensional communication paths 21, 22 are provided between 311a and 311b, and between 321a and 321b, respectively.

In the case where LSI_A and LSI_B are not stacked to each other, there is made up a scan chain extended from TDI_A to TDO_A via flip-flops 30a, 30b, the flip-flop 311a with the three-dimensional scan function attached thereto, flip-flop 321a with the three-dimensional scan function attached thereto, a flip-flop 30f in this order on the LSI_A. Similarly, there is made up a scan chain extended from TDI_B to TDO_B via the flip-flop 311b with the three-dimensional scan function attached thereto, a flip-flop 30e, and the flip-flop 321b with the three-dimensional scan function attached thereto in this order on the LSI_B.

On the other hand, in the case where LSI_A and LSI_B are stacked to each other, there is made up a scan chain extended from TDI_A to TDO_A via the flip-flops 30a, 30b, the flip-flop 311a with the three-dimensional scan function attached thereto, the flip-flop 311b with the three-dimensional scan function attached thereto, the flip-flop 30e, the flip-flop 321b with the three-dimensional scan function attached thereto, the flip-flop 321a with the three-dimensional scan function attached thereto, and the flip-flop 30f in this order Thus, the second embodiment of the invention is characterized in that the flip-flop with the three-dimensional scan function attached thereto that can be skipped over does not exist.

That is, the present embodiment has a drawback in that the flip-flops with the three-dimensional scan function attached thereto are each complex in configuration, so that a circuitry area as well as power consumption increases on a single flip-flop basis, however, in designing a scan chain, it needs only be sufficient to mechanically substitute the flip-flop with the three-dimensional scan function attached thereto for a flip-flop at a location for communication between LSI_A, and LSI_B. Therefore, the present embodiment has points in its favor in that not only designing is simpler but also the circuitry area in whole can be checked because a wasteful flip-flop with the three-dimensional scan function attached thereto is not present.

LIST OF REFERENCE SIGNS

100 . . . storage element
20, 21, 22 . . . TSV
200, 2001 . . . selector
211, 212 . . . electrode pad
213 . . . micro bump
30 . . . flip-flop with a scan function attached thereto
31, 311, 32, 321 . . . flip-flop with a three-dimensional scan function attached thereto
300 . . . downward chip stacking detector
301 . . . inverter logic gate
302 . . . pull-up resistor
3021 . . . pull-down resistor
303, 304 . . . node
400 . . . upward chip stacking detector
500 . . . output control AND gate

The invention claimed is:

1. A semiconductor device as a single semiconductor chip, comprising:
   a first combinational logic circuit;
   a first storage element for storing an input signal to the first combinational logic circuit;
   a first selector for selecting a signal to be stored by the first storage element from a signal from a first terminal or a signal from a second terminal;
   a scan chain with the first storage element connected thereto, provided without the intermediary of the first combinational logic circuit;
   a first electrode for receiving a predetermined potential from other semiconductor chip if the semiconductor chip, and the other semiconductor chip are stacked to each other,
   wherein a test signal supplied to the semiconductor chip is inputted to a first terminal, and a test signal supplied to the other semiconductor chip is inputted to a second terminal, if the predetermined potential is not supplied to the first electrode, the first selector selects the first terminal, and if the predetermined potential is supplied to the first electrode, the first selector selects the second terminal.

2. The semiconductor device according to claim 1, further comprising a first stacking detector connected to the first electrode, and the first selector,
   wherein if the predetermined potential is not supplied to the first electrode, the first stacking detector outputs a first signal for causing the first selector to select the first terminal to the first selector, and if the predetermined potential is supplied to the first electrode, the first stacking detector outputs a second signal for causing the first selector to select the second terminal to the first selector.

3. The semiconductor device according to claim 2, wherein the first stacking detector comprises a first selector controller, and a first resistor, the first electrode, and a first terminal of the first resistor are connected to an input terminal of the first selector controller, a first potential is supplied to a second terminal of the first resistor, an output terminal of the first selector controller is connected to the first selector, the first potential is supplied to an input terminal of the first selector controller via the first resistor if the semiconductor chip, and the other semiconductor chip are not stacked to each other, and a second potential is supplied to the input terminal of the first selector controller via the first electrode if the semiconductor chip, and the other semiconductor chip are stacked to each other, the predetermined potential being the second potential.

4. The semiconductor device according to claim 1, further comprising a second electrode, where a predetermined potential is supplied from a third semiconductor chip if the semiconductor chip, and the third semiconductor chip are stacked to each other, and a first output-control circuit connected to the first storage element, and the first combinational logic circuit,
wherein if the predetermined potential is not supplied to the second electrode, the first output-control circuit inputs information stored in the first storage element to the first combinational logic circuit, and if the predetermined potential is supplied to the second electrode, the first output-control circuit inputs a given value to the first combinational logic circuit regardless of the information stored in the first storage element.

5. The semiconductor device according to claim 4, further comprising a second stacking detector connected to the second electrode, and the first output-control circuit,
wherein if the semiconductor chip, and the third semiconductor chip are not stacked to each other, the second stacking detector inputs a third signal for causing the information stored in the first storage element to be inputted to the first combinational logic circuit to the first output-control circuit, and if the semiconductor chip, and the third semiconductor chip are stacked to each other, the second stacking detector inputs a fourth signal for causing a given value regardless of the information stored in the first storage element to be inputted to the first combinational logic circuit to the first output-control circuit.

6. The semiconductor device according to claim 1, further, comprising a fourth electrode for connecting the semiconductor chip to the third semiconductor chip, the fourth electrode supplying a second potential to an electrode provided in the third semiconductor chip.

7. The semiconductor device according to claim 6, wherein at least part of the fourth electrode is provided such that at least part thereof is positioned vertically upward or downward of the first electrode in relation to a substrate of the semiconductor chip.

8. A semiconductor device including a first semiconductor chip, and a second semiconductor chip, stacked to each other, the first semiconductor chip comprising:
a first combinational logic circuit;
a first storage element for storing an input signal to the first combinational logic circuit;
a second storage element for storing an output signal from the first combinational logic circuit;
a first selector for selecting a signal to be stored by the first storage element from a signal from a first terminal or a signal from a second terminal;
a first scan chain provided between the first second storage element and the second storage element without the intermediary of the first combinational logic circuit; and
a first electrode and a second electrode, connected to the second semiconductor chip,
the second semiconductor chip comprising:
a second combinational logic circuit;
a third storage element for storing an input signal to the second combinational logic circuit;
a fourth storage element for storing an output signal from the second combinational logic circuit;
a second selector for selecting a signal to be stored by the third storage element from a signal from a third terminal or a signal from a fourth terminal;
a second scan chain provided between the third storage element and the fourth storage element without the intermediary of the second combinational logic circuit; and
a third electrode and a fourth electrode, connected to the first semiconductor chip, said semiconductor device further comprising:
a first three-dimensional electrode for connecting the first electrode to the third electrode; and
a second three-dimensional electrode for connecting the second electrode to the fourth electrode,
wherein the second electrode gives a second potential to the fourth electrode via the second three-dimensional electrode, and the second selector selects information from the fourth terminal upon delivery of the second potential to the fourth electrode.

9. The semiconductor device according to claim 8, further comprising a third three-dimensional electrode for connecting the second combinational logic circuit to the first combinational logic circuit,
wherein the first combinational logic circuit and the second combinational logic circuit carry out exchange of information via the third three-dimensional electrode within a predetermined time period, thereby executing predetermined processing by use of the information.

10. The semiconductor device according to claim 8, wherein the second semiconductor chip further comprises a third stacking detector connected to the fourth electrode, and the second selector, and the third stacking detector inputs a fifth signal for causing an input signal from the fourth (input) terminal to be outputted to the second storage element to the second selector on the basis of the second potential supplied to the fourth electrode.

11. The semiconductor device according to claim 10, wherein the third stacking detector comprises a second selector controller, and a second resistor, the fourth electrode, and an end of the second resistor are connected to an input terminal of the second selector controller, a first potential is supplied to a second terminal of the second resistor, and the second potential is supplied to an input terminal of the second selector controller via the fourth electrode.

12. The semiconductor device according to claim 11, wherein a resistance value of the second resistor is larger than a resistance value of the second three-dimensional electrode.

13. The semiconductor device according to claim 8, wherein the first semiconductor chip further comprises a fifth electrode connected to the second semiconductor chip, and a second output-control circuit connected to the fifth electrode, and the first storage element while the second semiconductor chip further comprises a sixth electrode connected to the first semiconductor chip to supply the second potential to the fifth electrode, said semiconductor device further comprising a fourth three-dimensional electrode for connecting the fifth electrode to the sixth electrode, wherein the second output-control circuit outputs a given value to the first combinational logic circuit on the basis of the second potential supplied to the fifth electrode regardless of the information specified by (stored in) the first storage element.

14. The semiconductor device according to claim 13, further comprising a fourth stacking detector connected to the fifth electrode, and the second output-control circuit, wherein the fourth stacking detector outputs a sixth signal for causing the given value to be outputted to the first combinational logic circuit on the basis of the second potential supplied to the fifth electrode.

15. A semiconductor device testing method comprising the steps of:

preparing a semiconductor device wherein a first semiconductor chip having a first electrode and a second electrode is stacked to a second semiconductor chip including a second combinational logic circuit, a third storage element for storing input information to the second combinational logic circuit, a fourth storage element for storing output information from the second combinational logic circuit, second selector for selecting a signal to be stored by the third storage element from a signal from a third terminal or a signal from a fourth terminal, a third electrode, a fourth electrode, and a second scan chain provided between the third storage element and the fourth storage element without the intermediary of the second combinational logic circuit, the semiconductor device being set such that the first electrode is connected to the third electrode via a first three-dimensional electrode, the second electrode is connected to the fourth electrode via a second three-dimensional electrode, and the second selector selects information from the fourth terminal upon a second potential from the second electrode being given to the fourth electrode via the second three-dimensional electrode to be outputted to the third storage element; and supplying a first signal for testing the second combinational logic circuit to the second combinational logic circuit via the first electrode.

16. The semiconductor device testing method according to claim 15, wherein the first signal is a signal for testing a first combinational logic circuit of the first semiconductor chip or the second combinational logic circuit.

17. The semiconductor device testing method according to claim 15, wherein the second electrode further comprises a third three-dimensional electrode for connecting the first combinational logic circuit to the second combinational logic circuit, and the first combinational logic circuit and the second combinational logic circuit carry out exchange of information via the third three-dimensional electrode within a predetermined time period, thereby executing predetermined processing by use of the information.

* * * * *